United States Patent
Tadano

(10) Patent No.: US 8,269,559 B2
(45) Date of Patent: Sep. 18, 2012

(54) AMPLIFYING DEVICE

(75) Inventor: Tsuneaki Tadano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/039,766

(22) Filed: Mar. 3, 2011

(65) Prior Publication Data
US 2011/0316633 A1    Dec. 29, 2011

(30) Foreign Application Priority Data

Jun. 29, 2010 (JP) .................................. 2010-147631

(51) Int. Cl.
*H03G 3/10* (2006.01)
(52) U.S. Cl. ....................................... 330/285; 330/296
(58) Field of Classification Search .................. 330/285, 330/296, 124 R, 295, 279
See application file for complete search history.

(56) References Cited

U.S. PATENT DOCUMENTS

| | | | | |
|---|---|---|---|---|
| 4,602,218 | A * | 7/1986 | Vilmur et al. .................. | 330/279 |
| 5,410,272 | A * | 4/1995 | Haberland et al. ............. | 330/129 |
| 5,656,972 | A * | 8/1997 | Norimatsu ..................... | 330/129 |
| 5,757,229 | A | 5/1998 | Mitzlaff | |
| 7,092,265 | B2 * | 8/2006 | Kernahan ........................ | 363/65 |
| 2006/0001485 | A1 | 1/2006 | Parker et al. | |
| 2007/0075780 | A1 | 4/2007 | Krvavac et al. | |

FOREIGN PATENT DOCUMENTS

| | | |
|---|---|---|
| EP | 2093879 | 8/2009 |
| GB | 2421130 | 6/2006 |
| JP | 2000-513535 | 10/2000 |
| JP | 2007-134977 | 5/2007 |
| JP | 2008-22513 | 1/2008 |
| JP | 2008-147857 | 6/2008 |
| WO | 98/00912 | 1/1998 |
| WO | 03065599 | 8/2003 |

OTHER PUBLICATIONS

The extended European Search Report issued Dec. 21, 2011 from the corresponding EP11158359.7.
Yong-Sub Lee; et. al., "Highly Linear and Efficient Asymmetrical Doherty Power Amplifiers with Adaptively Bias-controlled Predistortion Drivers", Microwave Symposium Digest, 2009. MTT '09, IEEE MTT-S International, IEEE, Piscataway, NJ, USA, Jun. 7, 2009, pp. 1393-1396, XP031490788, ISBN: 978-1-4244-2803-8.

* cited by examiner

*Primary Examiner* — Henry Choe
(74) *Attorney, Agent, or Firm* — Katten Muchin Rosenman LLP

(57) ABSTRACT

In an amplifying device, an amplification unit includes a first amplifier which amplifies a signal and a second amplifier which amplifies a signal when the signal has a predetermined level or more. A detector detects a temperature change. A calculation unit calculates an adjacent channel leakage power ratio of an output signal output from the amplification unit based on detection of the temperature change of the detector. A controller controls gate biases of the first and second amplifiers based on the adjacent channel leakage power ratio calculated by the calculation unit.

8 Claims, 18 Drawing Sheets

AMPLIFYING DEVICE

CROSS-REFERENCE TO RELATED APPLICATION

This application is based upon and claims the benefit of priority of the prior Japanese Patent Application No. 2010-147631, filed on Jun. 29, 2010 the entire contents of which are incorporated herein by reference.

FIELD

The embodiment discussed herein is related to an amplifying device which amplifies signals.

BACKGROUND

In recent years, a Doherty circuit has been widely used for a transmitting high output amplifier of a mobile communication base station. As advantages of the Doherty circuit, its power efficiency is infinitely larger than that of a single amplifier or a parallel-connected amplifier.

The Doherty circuit has a carrier amplifier and a peak amplifier. The carrier amplifier is biased in class A or AB mode, and the peak amplifier is biased in class C mode (see, for example, Japanese Laid-open Patent publications No. 2007-134977, 2008-147857, and 2008-22513, and Published Japanese Translation of a PCT Application No. 2000-513535). Input signals are distributed into two, and one signal is given to the carrier amplifier and the other signal is given to the peak amplifier via a λ/4 line.

In the Doherty circuit, when an input signal is small, only the carrier amplifier operates, and on the other hand, the peak amplifier does not operate. However, when the input signal voltage is larger than a pinch-off voltage biased in class C mode of the peak amplifier, the peak amplifier rises up. Then, an output signal from the peak amplifier is synthesized in the same phase as that from the carrier amplifier via a λ/4 line. As can be seen from the above sequence, the Doherty circuit has excellent power efficiency in view of the fact that only the carrier amplifier operates during a small-signal operation.

Note that in the Doherty circuit, since linearity is deformed, intermodulation distortion is caused. To cope with the above-described problem, as a technique for canceling distortion, a distortion compensation is mainly performed by using digital pre-distortion (hereinafter, referred to as DPD).

However, there is a problem that since the gate bias of the Doherty circuit is fixed, when an optimal operating point fluctuates based on a temperature change, the gate bias and the optimal operating point are not matched with each other, and therefore, the power efficiency is deteriorated.

In addition, there is a problem that when the optimal operating point fluctuates based on a frequency change of input signals, the gate bias and the optimal operating point are not matched with each other, and therefore, the power efficiency is deteriorated.

SUMMARY

According to one aspect of the present invention, this amplifying device includes: an amplification unit including a first amplifier to amplify the signal and a second amplifier to amplify the signal when the signal has a predetermined level or more; a detector to detect a temperature change; a calculation unit to calculate an adjacent channel leakage power ratio of an output signal output from the amplification unit in response to detection of the temperature change of the detector; and a controller to control gate biases of the first and second amplifiers based on the adjacent channel leakage power ratio calculated by the calculation unit.

The object and advantages of the invention will be realized and attained by means of the devices and combinations particularly pointed out in the claims.

It is to be understood that both the foregoing general description and the following detailed description are exemplary and explanatory and are not restrictive of the invention, as claimed.

DESCRIPTION OF EMBODIMENTS

A first embodiment of the present invention will now be described in detail below with reference to the accompanying drawings.

Figure 1:
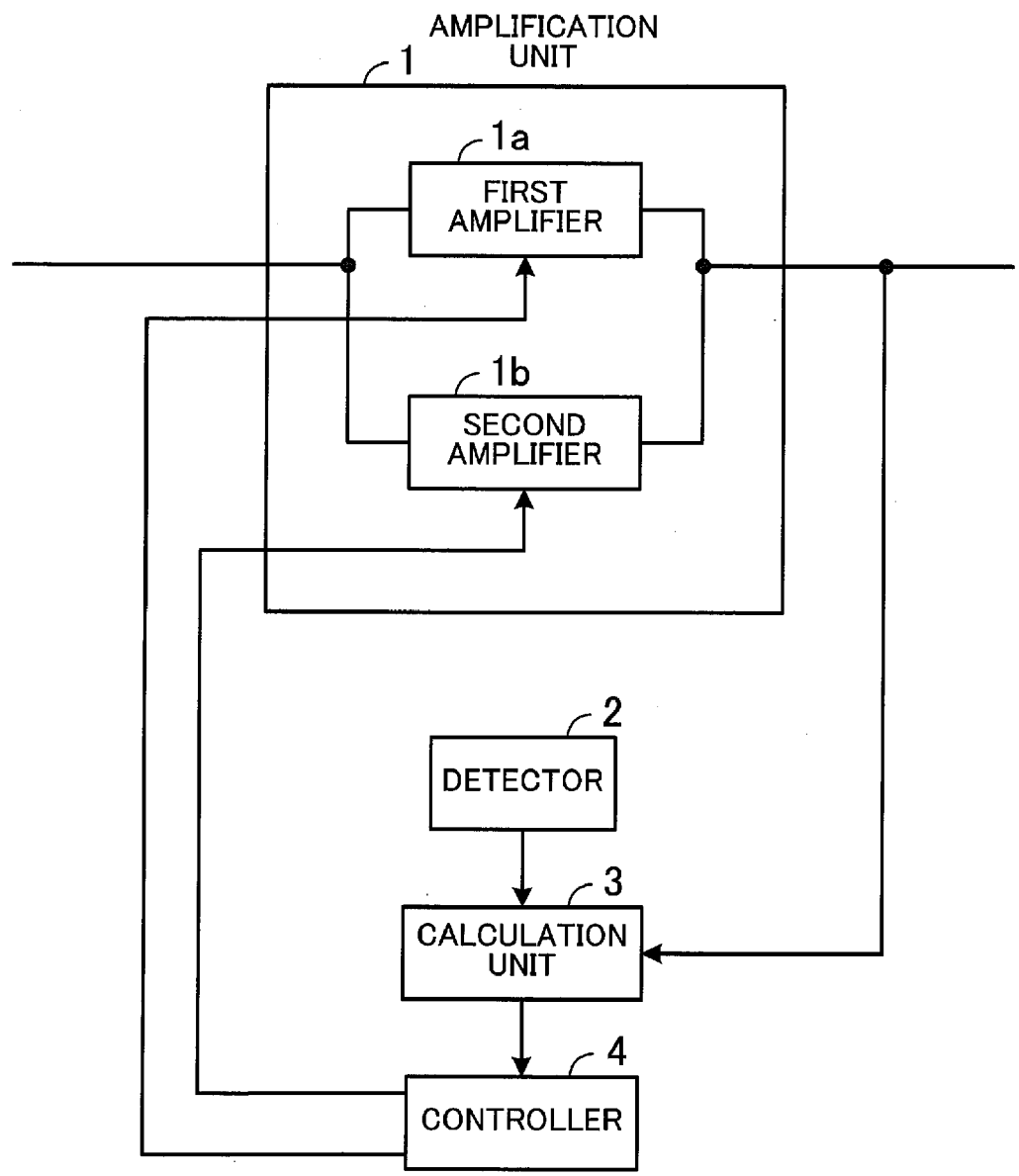
FIG. 1 illustrates an amplifying device according to a first embodiment.

FIG. 1 illustrates an amplifying device according to the first embodiment. As illustrated in FIG. 1, the amplifying device includes an amplification unit 1, a detector 2, a calculation unit 3, and a controller 4.

The amplification unit 1 has a first amplifier 1a and a second amplifier 1b. The first amplifier 1a amplifies an input signal. When the input signal has a predetermined level or more, the second amplifier 1b amplifies it. Suppose, for example, that the amplification unit 1 has a Doherty circuit.

The detector 2 detects a temperature change.

The calculation unit 3 calculates an adjacent channel leakage power ratio of output signals from the amplification unit 1 based on detection of the temperature change of the detector 2.

The controller 4 controls gate biases of the first amplifier 1a and the second amplifier 1b based on the adjacent channel leakage power ratio calculated by the calculation unit 3. For example, the controller 4 controls the gate bias such that the adjacent channel leakage power ratio is smaller than and approximated to the predetermined threshold. The predetermined threshold is, for example, the adjacent channel leakage power ratio requested by the amplification unit 1. This process permits the controller 4 to approximate the gate bias to an optimal operating point fluctuating based on the temperature change.

As can be seen from the above sequence, the amplifying device calculates, when detecting the temperature change, the adjacent channel leakage power ratio, and controls the gate bias of the amplification unit 1 based on the calculated adjacent channel leakage power ratio. This process permits the amplifying device to control the gate bias with respect to the optimal operating point fluctuating based on the temperature change and increase power efficiency even if the optimal operating point fluctuates based on the temperature change.

Next, a second embodiment will be described in detail with reference to the accompanying drawings.

Figure 2:
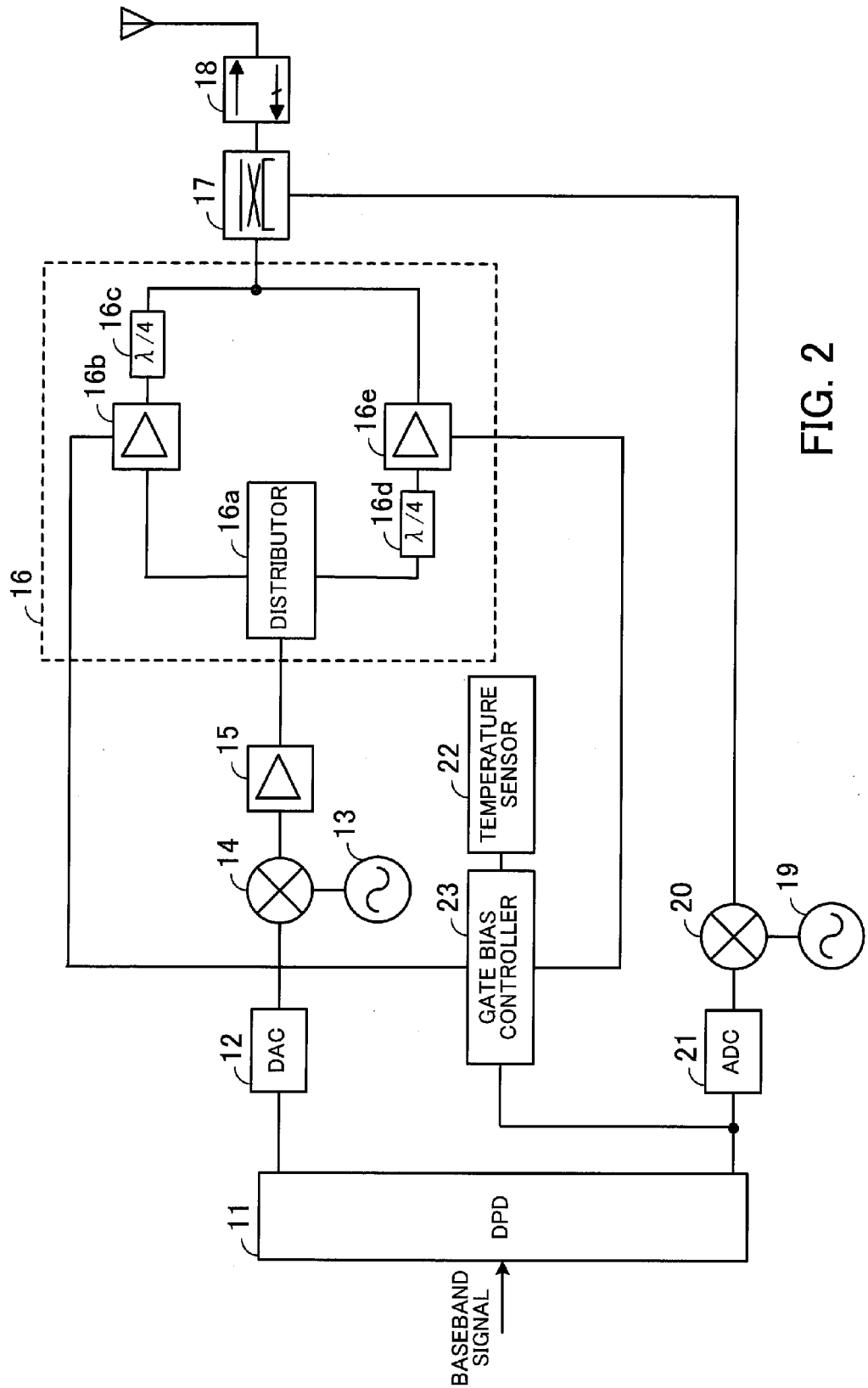
FIG. 2 is a block diagram illustrating a transmitter using the amplifying device according to a second embodiment.

FIG. 2 is a block diagram illustrating a transmitter using the amplifying device according to the second embodiment. As illustrated in FIG. 2, the transmitter has a DPD 11, a DAC (digital to analog converter) 12, oscillators 13 and 19, multipliers 14 and 20, an amplifier 15, a Doherty circuit 16, a coupler 17, an isolator 18, an ADC (analog to digital converter) 21, a temperature sensor 22, and a gate bias controller 23. The transmitter illustrated in FIG. 2 is used in a base station of, for example, a third-generation and 3.9-generation mobile phones.

To the DPD 11, for example, baseband signals (IQ signals) to be transmitted to a receiver of the mobile phone are input. Further, to the DPD 11, feedback signals of signals wirelessly transmitted to the receiver are input via the coupler 17.

In the signals wirelessly transmitted to the receiver, a distortion is caused by the amplifier 15 and the Doherty circuit 16. The DPD 11 calculates a distortion compensation coefficient for compensating a distortion of the signals wirelessly transmitted to the receiver, and multiplies the input baseband signals by the calculated distortion compensation coefficient to thereby compensate the distortion of the signals. The DPD 11 calculates the distortion compensation coefficient based on the input baseband signals and feedback signals.

The DAC 12 converts the digital baseband signals output from the DPD 11 into analog baseband signals and outputs them to the multiplier 14.

The multiplier 14 multiplies the baseband signals output from the DAC 12 by oscillation signals output from the oscillator 13, and converts the baseband signals output from the DAC 12 into a radio-frequency signal. As the oscillator 13, for example, a PLL (phase locked loop) oscillator is used.

The amplifier 15 amplifies the signal output from the multiplier 14. The Doherty circuit 16 amplifies the signal output from the amplifier 15 up to the signal with a desired power level, and outputs it to the coupler 17.

The Doherty circuit 16 has a distributor 16a, a carrier amplifier 16b, λ/4 lines (λ/4 is each illustrated in the diagram) 16c and 16d, and a peak amplifier 16e.

The distributor 16a distributes power of the signal output from the amplifier 15, and outputs it to the carrier amplifier 16b and the peak amplifier 16e.

A phase of the signal output from the carrier amplifier 16b is delayed by 90 degrees by the λ/4 line 16c. A phase of the signal input to the peak amplifier 16e is delayed by 90 degrees by the λ/4 line 16d. This process permits the Doherty circuit 16 to synthesize the one signal output from the λ/4 line 16c and the other signal output from the peak amplifier 16e in the same phase and output the synthesized signals to the coupler 17.

The carrier amplifier 16b operates in class A or AB mode, and the peak amplifier 16e operates in high-efficiency class C. In the Doherty circuit 16, the carrier amplifier 16b operates solely until an input signal voltage becomes greater than a pinch-off voltage of the peak amplifier 16e. At this time, supposing, for example, that the impedance of a load connected to the Doherty circuit 16 is set to $Z_0/2$, the impedance viewed from the output side of the carrier amplifier 16b is equal to $2Z_0$.

In the Doherty circuit 16, when the voltage level of the input signal is greater than the pinch-off voltage of the peak amplifier 16e, the peak amplifier 16e starts operating and drives the load along with the carrier amplifier 16b. At this time, the impedance viewed from the output side of the carrier amplifier 16b is reduced to $Z_0$, and the carrier amplifier 16b operates at the maximum efficiency for the purpose of keeping the output voltage at a certain level.

The coupler 17 outputs the signal amplified by the Doherty circuit 16 to the isolator 18, and at the same time, outputs a part of the signal to the multiplier 20.

The isolator 18 outputs the signal output from the coupler 17 to the antenna. Further, the isolator 18 outputs the signal received by the antenna to a receiver (not illustrated in FIG. 2). The receiver demodulates the signal from a mobile phone received by the antenna, and outputs the demodulated signal to a higher-level device of the base station.

The multiplier 20 multiplies the signal output from the coupler 17 by an oscillation signal output from the oscillator 19, and converts the radio-frequency signal output from the coupler 17 into the baseband signal.

The ADC 21 converts the analog signal output from the multiplier 20 into a digital signal, and outputs the converted digital signal to the DPD 11 and the gate bias controller 23.

The temperature sensor 22 measures a temperature. The gate bias controller 23 will be described in detail below. Based on a change in the temperature measured by the temperature sensor 22, the gate bias controller 23 controls the gate biases of the carrier amplifier 16b and the peak amplifier 16e of the Doherty circuit 16.

The Doherty circuit 16 will be described in detail.

Figure 3:
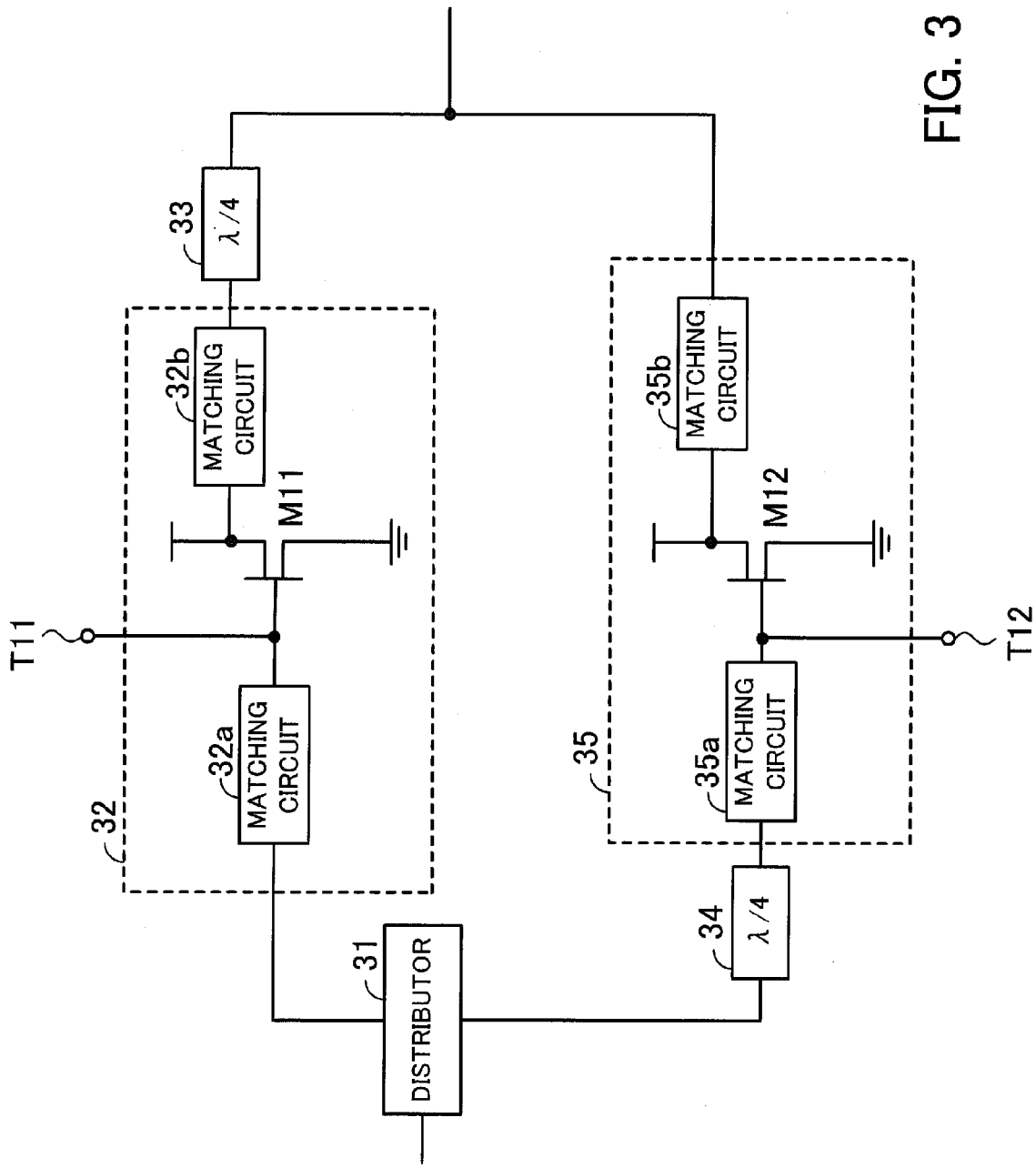
FIG. 3 illustrates details of a Doherty circuit.

FIG. 3 illustrates details of the Doherty circuit. As illustrated in FIG. 3, the Doherty circuit 16 has a distributor 31, a carrier amplifier 32, λ/4 lines 33 and 34, and a peak amplifier 35. The distributor 31, carrier amplifier 32, λ/4 lines 33 and 34, and peak amplifier 35 illustrated in FIG. 3 correspond to the distributor 16a, carrier amplifier 16b, λ/4 lines 16c and 16d, and peak amplifier 16e of the Doherty circuit 16 illustrated in FIG. 2, respectively.

The carrier amplifier 32 has matching circuits 32a and 32b, and a transistor M11. The matching circuit 32a matches the output impedance of the distributor 31 and the input impedance of a gate of the transistor M11. The matching circuit 32b matches the output impedance of a drain of the transistor M11 and the input impedance of the λ/4 line 33.

The drain of the transistor M11 is connected to a power source, and a source of the transistor M11 is connected to the ground. The gate of the transistor M11 is connected to the gate bias controller 23 illustrated in FIG. 2 via the terminal T11. To the gate of the transistor M11, a gate bias for causing the transistor M11 to operate in class A or AB mode is input from the gate bias controller 23.

The peak amplifier 35 has matching circuits 35a and 35b, and a transistor M12. The matching circuit 35a matches the output impedance of the λ/4 line 34 and the input impedance of a gate of the transistor M12. The matching circuit 35b matches the output impedance of a drain of the transistor M12 and the input impedance of the load.

The drain of the transistor M12 is connected to the power source, and a source of the transistor M12 is connected to the ground. The gate of the transistor M12 is connected to the gate bias controller 23 illustrated in FIG. 2 via the terminal T12. To the gate of the transistor M12, a gate bias for causing the transistor M12 to operate in class C mode is input from the gate bias controller 23.

Figure 4:
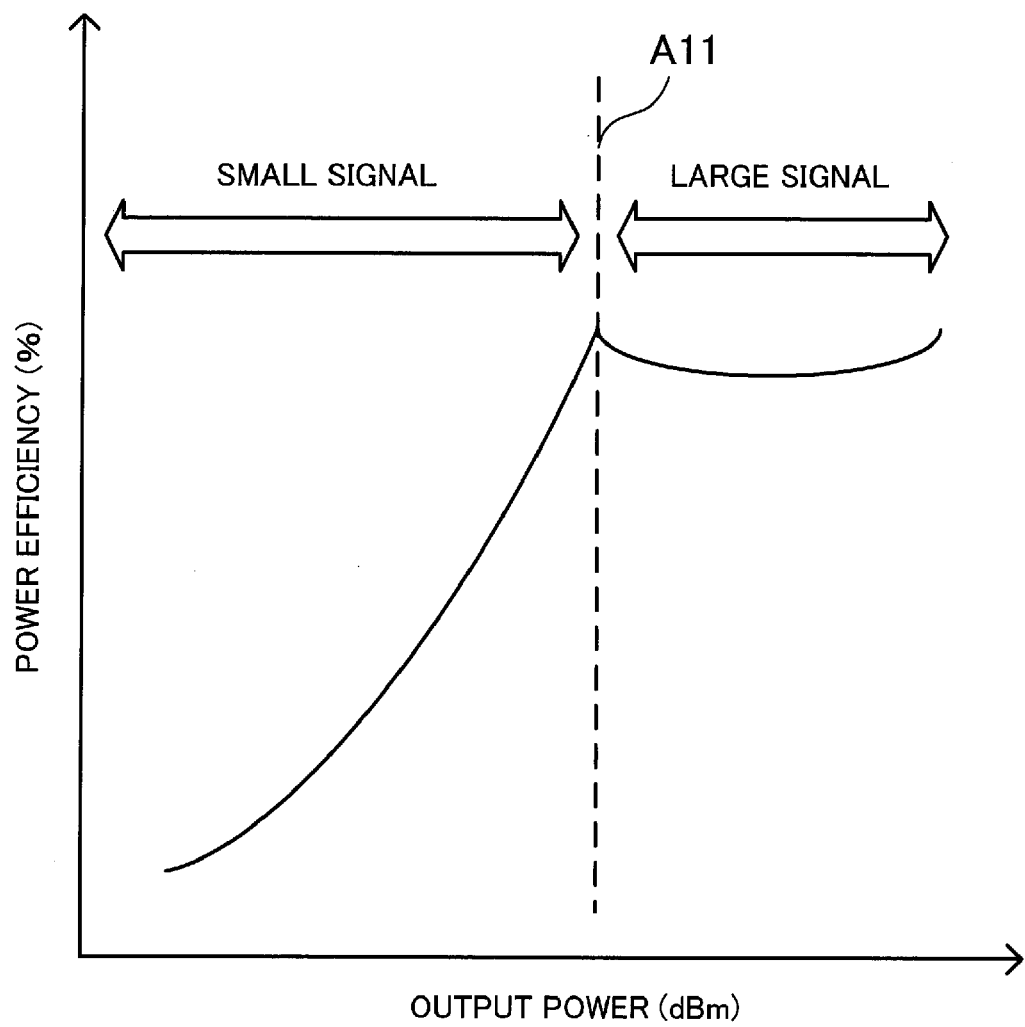
FIG. 4 illustrates a relationship between output power and power efficiency of the Doherty circuit.

FIG. 4 illustrates a relationship between the output power and power efficiency of the Doherty circuit. The horizontal axis of a graph illustrated in FIG. 4 represents the output power of the Doherty circuit 16 and the vertical axis represents the power efficiency of the Doherty circuit 16.

In the Doherty circuit 16, when the output power is small (the input signal is small), only the carrier amplifier 32 operates. In the Doherty circuit 16, when the input signal becomes large and the output power reaches a rising point of the peak amplifier illustrated in a broken line A11 of FIG. 4, the peak amplifier 35 starts to operate. The power efficiency of the Doherty circuit 16 rises up along with the rise of the output signal when the output signal is small, and on the other hand, remains approximately unchanged when the output signal is large.

There will be described a relationship between the gate bias and ACLR (adjacent channel leakage power ratio) of the Doherty circuit 16, and a relationship between the gate bias and the power efficiency.

Figure 5:
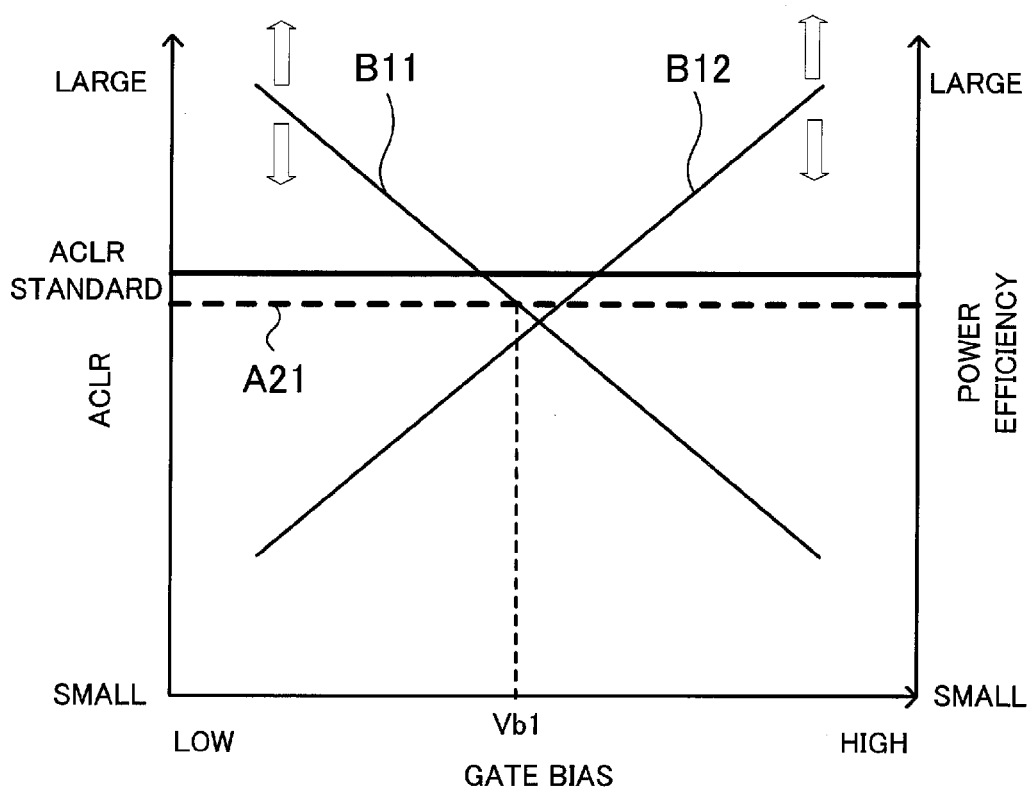
FIG. 5 illustrates a relationship between a gate bias and ACLR of the Doherty circuit, and that between the gate bias and power efficiency thereof.

FIG. 5 illustrates a relationship between the gate bias and ACLR of the Doherty circuit, and a relationship between the gate bias and the power efficiency. The horizontal axis of a graph illustrated in FIG. 5 represents the gate bias of the Doherty circuit 16, and the vertical axis represents the ACLR and power efficiency of the Doherty circuit 16. For the purpose of simplifying the description, the gate biases of the carrier amplifier 32 and peak amplifier 35 of the Doherty circuit 16 are not discriminated, but may be described below as the gate bias.

A straight line B11 illustrated in FIG. 5 represents the relationship between the gate bias and the ACLR. As illustrated in the straight line B11, in the Doherty circuit 16, when the gate bias is lowered, the ACLR is deteriorated whereas when the gate bias is raised, the ACLR is improved.

A straight line B12 illustrated in FIG. 5 represents the relationship between the gate bias and the power efficiency. As illustrated in the straight line B12, in the Doherty circuit 16, when the gate bias is lowered, the power efficiency is improved whereas when the gate bias is raised, the power efficiency is deteriorated.

As can be seen from the above sequence, the ACLR and the power efficiency have a trade-off relationship with respect to the gate bias.

The standard of the ACLR is specified in 3GPP (3rd Generation Partnership Project) and IEEE (Institute of Electrical and Electronics Engineers, Inc.). The optimal operating point of the gate bias in the Doherty circuit 16 is a point in which the carrier amplifier 32 operates in the class A or AB mode, the peak amplifier 35 operates in the class C mode, the Doherty circuit 16 satisfies the ACLR standard, and the power efficiency is maximized.

As illustrated in a broken line A21 of FIG. 5, for example, the ACLR to be set in the Doherty circuit 16 is set to a value smaller than that of the ACLR standard. The reason is that the ACLR is provided with a margin and the Doherty circuit 16 satisfies the ACLR standard also against the temperature change.

The optimal operating point of the Doherty circuit 16 is a point in which the ACLR of the Doherty circuit 16 is smaller than that of this set broken line A21 and the power efficiency is maximized. In the case of FIG. 5, a gate bias Vb1 indicates the optimal operating point.

The ACLR and power efficiency of the Doherty circuit 16 change based on the temperature. As indicated by arrows of FIG. 5, for example, the straight lines B11 and B12 move up and down based on the temperature. In this case, the optimal operating point of the gate bias fluctuates.

Suppose, for example, that In FIG. 5, the straight lines B11 and B12 move down based on the temperature change. In this case, the optimal operating point of the gate bias becomes lower than the gate bias Vb1 illustrated in FIG. 5.

To cope with the above-described problem, the gate bias controller 23 illustrated in FIG. 2 detects the temperature change, and controls the gate bias of the Doherty circuit 16 to be positioned at the optimal operating point moved based on the temperature change. This process permits the gate bias controller 23 to increase the power efficiency as compared with the gate bias Vb1.

Figure 6:
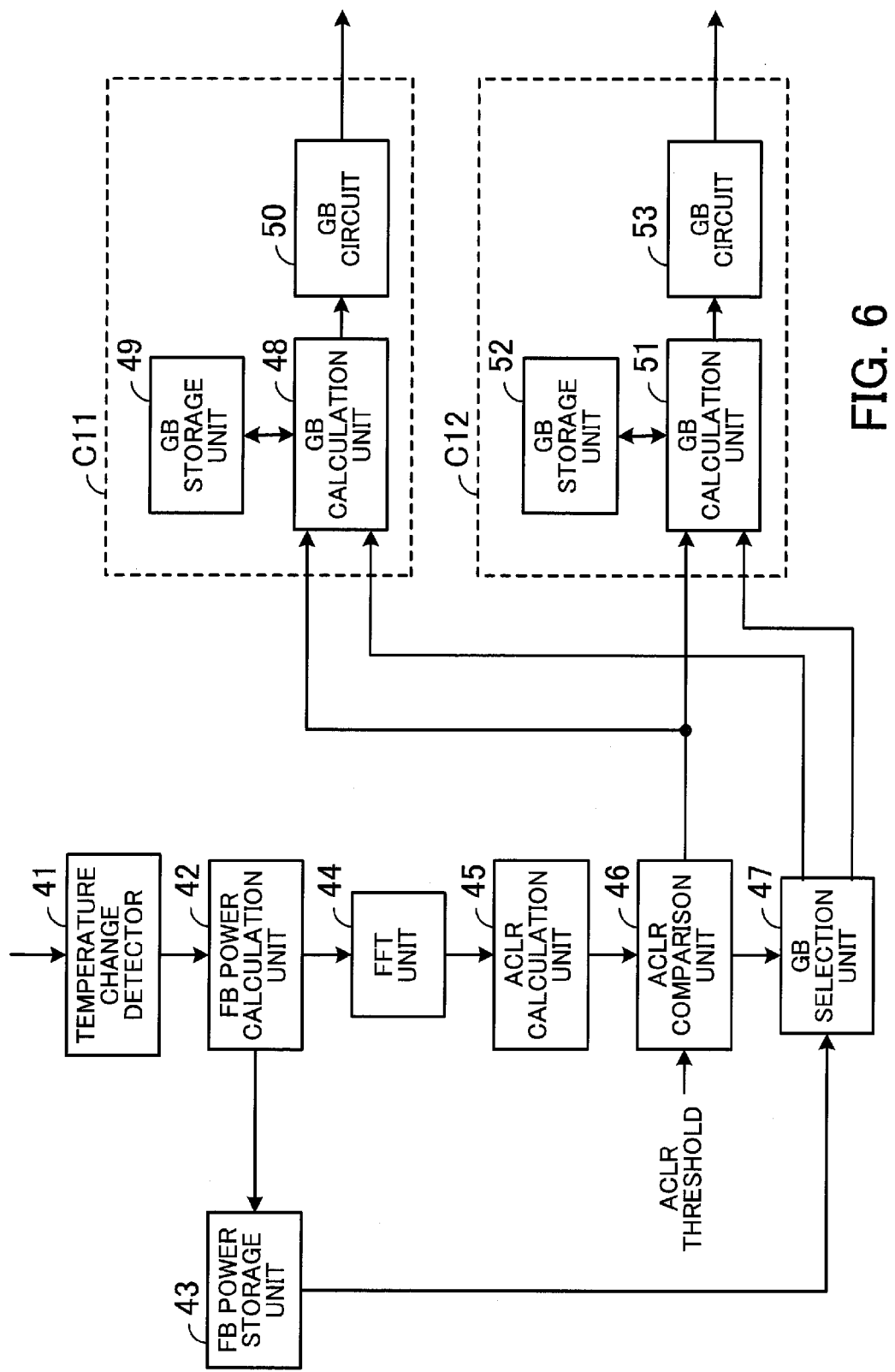
FIG. 6 is a block diagram illustrating a gate bias controller.

FIG. 6 is a block diagram of the gate bias controller. As illustrated in FIG. 6, the gate bias controller 23 has a temperature change detector 41, FB power calculation unit 42, FB power storage unit 43, FFT (fast fourier transform) unit 44, ACLR calculation unit 45, ACLR comparison unit 46, GB selection unit 47, GB calculation units 48 and 51, GB storage units 49 and 52, and GB circuits 50 and 53. The temperature change detector 41, FB power calculation unit 42, FB power storage unit 43, FFT unit 44, ACLR calculation unit 45, ACLR comparison unit 46, GB selection unit 47, GB calculation units 48 and 51, and GB storage units 49 and 52 illustrated in FIG. 6 can be formed, for example, by using a CPU (central processing unit) or a memory.

To the temperature change detector 41, a temperature measured by the temperature sensor 22 is input. The temperature change detector 41 detects the temperature change based on the temperature from the temperature sensor 22. For example, when a predetermined temperature is raised or lowered, the temperature change detector 41 detects the temperature change.

When the temperature change is detected by the temperature change detector 41, the FB power calculation unit 42 calculates power of the feedback signal output from the ADC 21.

The FB power storage unit 43 stores the power of the feedback signal calculated by the FB power calculation unit 42.

The FFT unit 44 performs FFT processing of the feedback signal, and converts the feedback signal in the time domain to data in the frequency domain.

Based on the data in the frequency domain calculated by the FFT unit 44, the ACLR calculation unit 45 calculates carrier band power and distortion band power to thereby calculate the ACLR.

The ACLR comparison unit 46 compares the ACLR calculated by the ACLR calculation unit 45 and the ACLR threshold. The ACLR threshold may be set to a standard value of the ACLR, or a value obtained by providing a margin on the ACLR standard value as described above.

Based on power of the feedback signal stored in the FB power storage unit 43, the GB selection unit 47 determines whether the peak amplifier 35 operates. The GB selection unit 47 can know the output power of the Doherty circuit 16 based on the power of the feedback signal. As illustrated in FIG. 4, the GB selection unit 47 can determine based on the output power whether the peak amplifier 16e operates.

For example, when the power of the feedback signal is smaller than a predetermined power threshold, the GB selection unit 47 can determine that the peak amplifier 16e does not operate. The predetermined power threshold is set to, for example, a value obtained by subtracting a PAPR (peak to average power ratio) from the peak amplifier rising point illustrated in the broken line A11 of FIG. 4.

Based on the operation determination result of the peak amplifier 35, the GB selection unit 47 determines whether the gate bias of the carrier amplifier 16b is changed or the gate bias of the peak amplifier 16e is changed. For example, when determining that the peak amplifier 35 does not operate, the GB selection unit 47 determines that the gate bias of the carrier amplifier 16b is changed. On the other hand, when determining that the peak amplifier 35 operates, the GB selection unit 47 determines that the gate bias of the peak amplifier 16e is changed.

A broken line frame C11 illustrated in FIG. 6 illustrates one controller which changes the gate bias of the carrier amplifier 16b, and on the other hand, a broken line frame C12 illustrates another controller which changes the gate bias of the peak amplifier 16e.

When the GB selection unit 47 determines that the peak amplifier 16e does not operate, the GB calculation unit 48 illustrated in the broken line frame C11 calculates the gate bias to be supplied to the carrier amplifier 16b. The GB calculation unit 48 calculates the gate bias of the carrier amplifier 16b based on the comparison result of the ACLR comparison unit 46 and the gate bias stored in the GB storage unit 49. The GB calculation unit 48 outputs the calculated gate bias to the GB circuit 50, and stores it in the GB storage unit 49.

For example, when the ACLR comparison unit 46 determines that the ACLR is smaller than the ACLR threshold, the GB calculation unit 48 subtracts a predetermined value from the gate bias stored in the GB storage unit 49. That is, when the ACLR comparison unit 46 determines that the ACLR is smaller than the ACLR threshold, the GB calculation unit 48 subtracts the predetermined value from the previously-calculated gate bias. The GB calculation unit 48 outputs the calculated gate bias to the GB circuit 50, and stores it in the GB storage unit 49.

On the other hand, when the ACLR comparison unit 46 determines that the ACLR is larger than or equal to the ACLR threshold, the GB calculation unit 48 adds a predetermined value to the gate bias stored in the GB storage unit 49. That is, when the ACLR comparison unit 46 determines that the ACLR is larger than or equal to the ACLR threshold, the GB calculation unit 48 adds a predetermined value to the previously-calculated gate bias. The GB calculation unit 48 outputs the calculated gate bias to the GB circuit 50, and stores it in the GB storage unit 49.

The GB circuit 50 converts a digital gate bias value calculated by the GB calculation unit 48 into a voltage, and outputs it to the carrier amplifier 16b.

When the GB selection unit 47 determines that the peak amplifier 16e operates, the GB calculation unit 51 illustrated in the broken line frame C12 calculates the gate bias to be supplied to the peak amplifier 16e. The GB calculation unit 51 calculates the gate bias of the peak amplifier 16e based on the comparison result of the ACLR comparison unit 46 and the gate bias stored in the GB storage unit 52. The GB calculation unit 51 outputs the calculated gate bias to the GB circuit 53, and stores it in the GB storage unit 52.

For example, when the ACLR comparison unit 46 determines that the ACLR is smaller than the ACLR threshold, the GB calculation unit 51 subtracts a predetermined value from the gate bias stored in the GB storage unit 49. That is, when the ACLR comparison unit 46 determines that the ACLR is smaller than the ACLR threshold, the GB calculation unit 51 subtracts the predetermined value from the previously-calculated gate bias. The GB calculation unit 51 outputs the calculated gate bias to the GB circuit 53, and stores it in the GB storage unit 52.

On the other hand, when the ACLR comparison unit 46 determines that the ACLR is larger than or equal to the ACLR threshold, the GB calculation unit 51 adds a predetermined value to the gate bias stored in the GB storage unit 52. That is, when the ACLR comparison unit 46 determines that the ACLR is larger than or equal to the ACLR threshold, the GB calculation unit 51 adds the predetermined value to the previously-calculated gate bias. The GB calculation unit 51 outputs the calculated gate bias to the GB circuit 53, and stores it in the GB storage unit 52.

The GB circuit 53 converts a digital gate bias value calculated by the GB calculation unit 51 into a voltage, and outputs it to the peak amplifier 16e.

Figure 7:
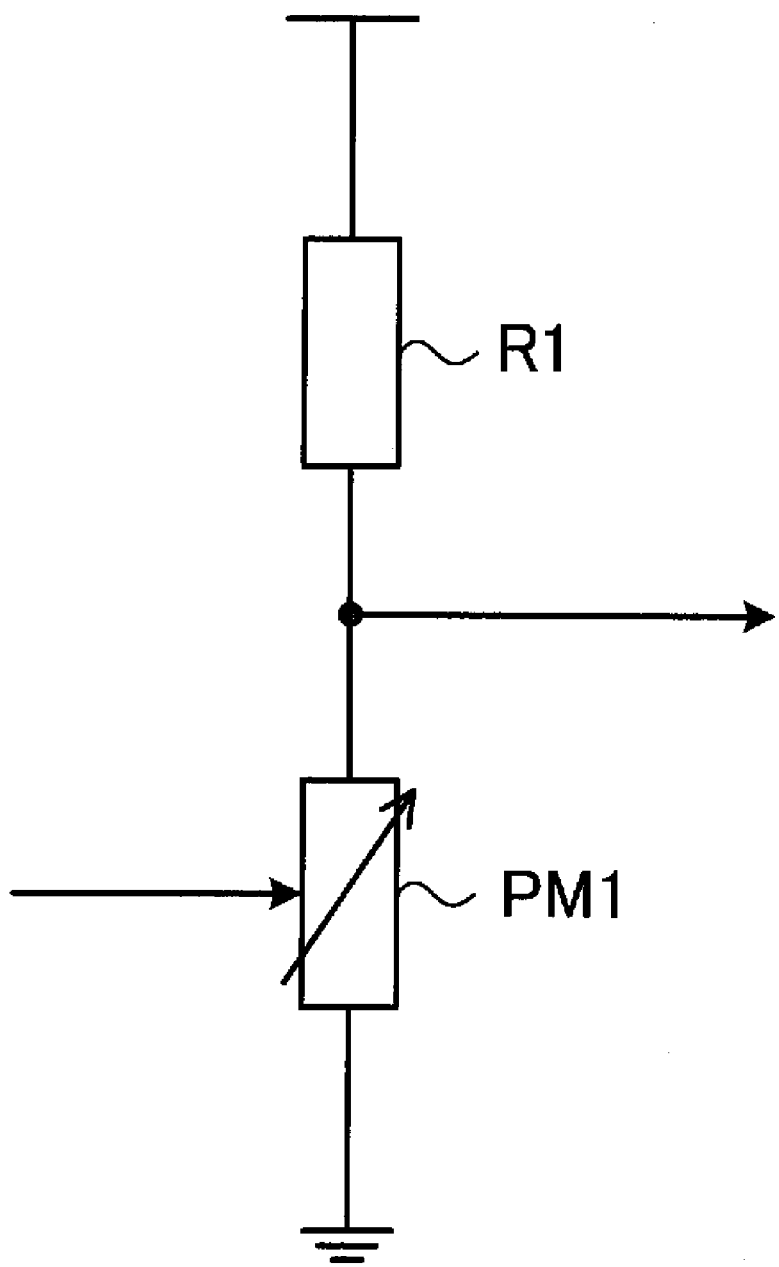
FIG. 7 illustrates a GB circuit.

FIG. 7 illustrates the GB circuit. In FIG. 7, the GB circuit 50 will be described, and also the GB circuit 53 has the same circuit as the GB circuit 50.

As illustrated in FIG. 7, the GB circuit 50 has a resistor R1 and a digital potentiometer PM1. The resistor R1 and the digital potentiometer PM1 are serially connected between the power source and the ground. A connection point between the resistor R1 and the digital potentiometer PM1 is connected to the gate of the transistor M11 via the terminal T11 illustrated in FIG. 3.

To the digital potentiometer PM1, the digital gate bias calculated by the GB calculation unit 48 is input. A resistor value of the digital potentiometer PM1 is changed according to the input digital gate bias value, and a voltage value proportional to the gate bias value is output from the connection point between the resistor R1 and the digital potentiometer PM1.

Figure 8:
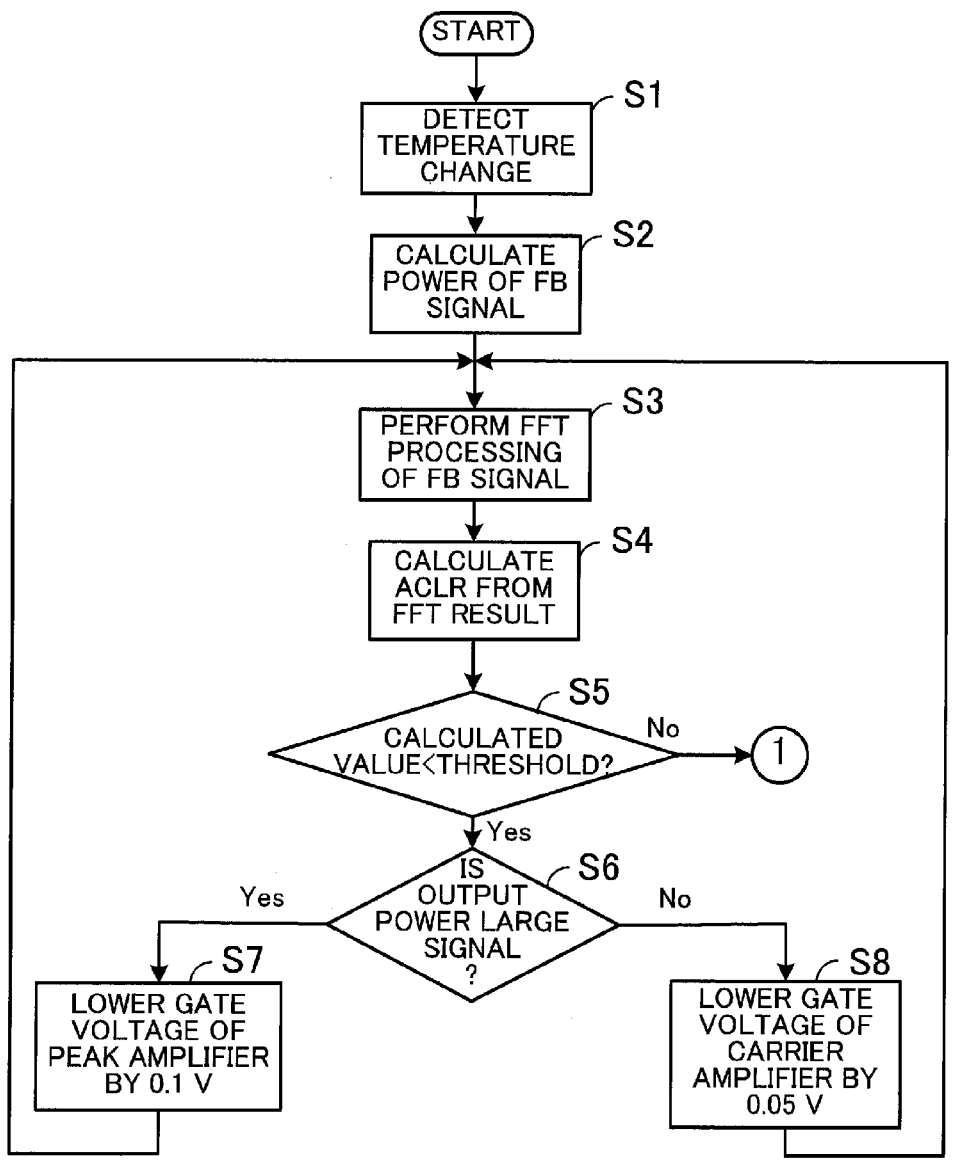
FIG. 8 is a flowchart illustrating operations of the gate bias controller.
Figure 9:
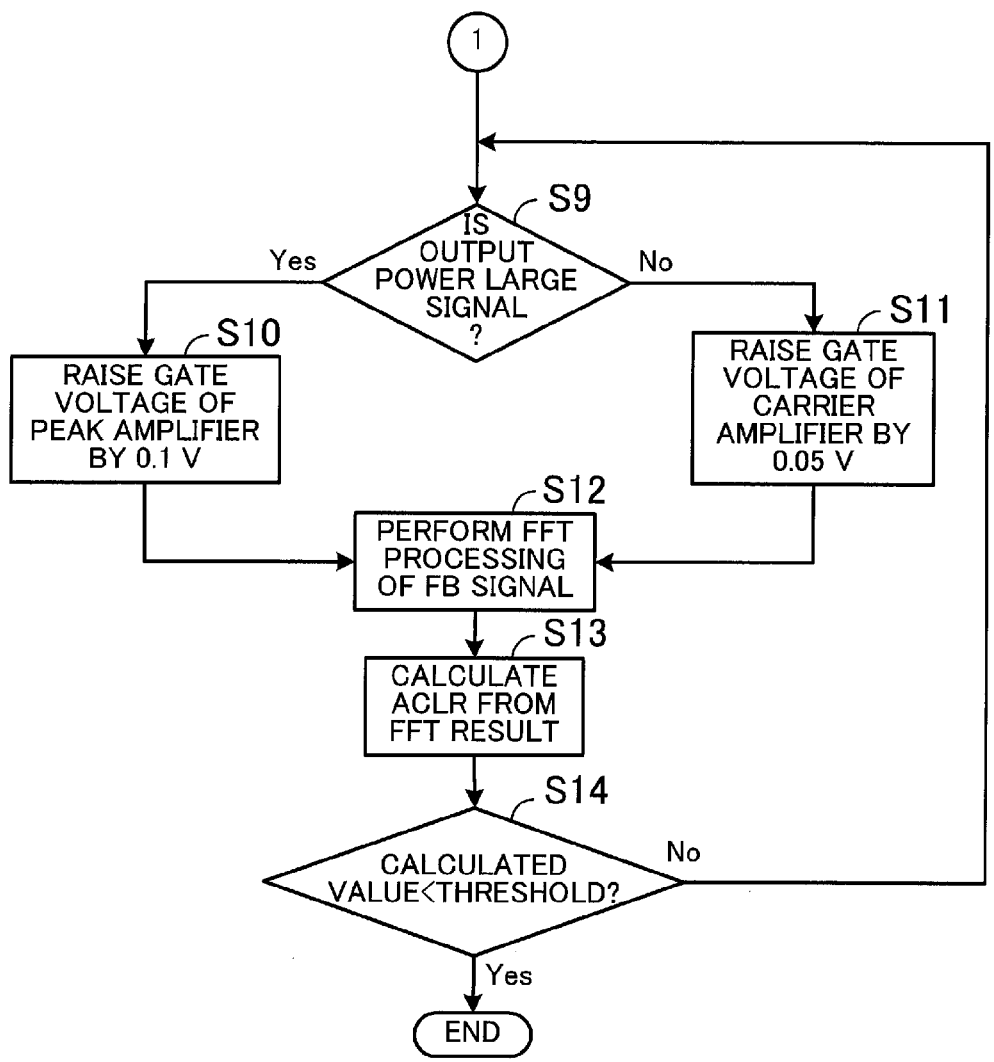
FIG. 9 is a flowchart illustrating the operations of the gate bias controller.

FIGS. 8 and 9 are a combined flowchart illustrating the operations of the gate bias controller.

[Step S1] The temperature change detector 41 detects the temperature change based on the temperature measured by the temperature sensor 22. For example, when the temperature measured by the temperature sensor 22 is raised or lowered by a predetermined temperature, the temperature change detector 41 detects the temperature change.

[Step S2] When the temperature change detector 41 detects the temperature change, the FB power calculation unit 42 calculates power of the feedback signal output from the ADC 21. The FB power calculation unit 42 stores the power of the calculated feedback signal in the FB power storage unit 43.

[Step S3] The FFT unit 44 performs FFT processing of the feedback signal output from the ADC 21, and converts the feedback signal in the time domain into data in the frequency domain.

[Step S4] Based on the data in the frequency domain calculated by the FFT unit 44, the ACLR calculation unit 45 calculates the carrier band power and the distortion band power to thereby calculate the ACLR.

[Step S5] The ACLR comparison unit 46 compares the ACLR calculated by the ACLR calculation unit 45 and the ACLR threshold. If the calculated ACLR is smaller than the ACLR threshold, the ACLR comparison unit 46 goes to step S6 to improve the power efficiency. If the calculated ACLR is larger than or equal to the ACLR threshold, the ACLR comparison unit 46 goes to step S9 to cause the Doherty circuit 16 to satisfy the ACLR threshold.

[Step S6] Based on the power of the feedback signal stored in the FB power storage unit 43, the GB selection unit 47 determines whether the output power of the Doherty circuit 16 is large. That is, the GB selection unit 47 determines whether the peak amplifier 35 operates. When determining that the output power of the Doherty circuit 16 is large, the GB selection unit 47 goes to step S7 to control the gate bias of the peak amplifier 16e. When determining that the output power of the Doherty circuit 16 is not large, namely, small, the GB selection unit 47 goes to step S8 to control the gate bias of the carrier amplifier 16b.

[Step S7] The GB calculation unit 51 calculates the gate bias to be supplied to the peak amplifier 16e. Since the ACLR comparison unit 46 determines in step S5 that the ACLR is smaller than the ACLR threshold, the GB calculation unit 51 subtracts a predetermined value from the current gate bias value, which is stored in the GB storage unit 52, output to the peak amplifier 16e.

For example, the GB calculation unit 51 subtracts a predetermined value from the gate bias value stored in the GB storage unit 52 so as to reduce the current gate bias voltage output to the peak amplifier 16e by 0.1 V. The calculated gate bias value is output to the GB circuit 53, and the gate bias voltage smaller than the current voltage by 0.1 V is output to the gate of the transistor M12 of the peak amplifier 16e.

The GB calculation unit 51 stores the calculated gate bias in the GB storage unit 52, and goes to step S3 to determine whether the Doherty circuit 16 satisfies the ACLR threshold by using the calculated gate bias.

[Step S8] The GB calculation unit 48 calculates the gate bias to be supplied to the carrier amplifier 16b. Since the ACLR comparison unit 46 determines in step S5 that the ACLR is smaller than the ACLR threshold, the GB calculation unit 48 subtracts a predetermined value from the current gate bias value, which is stored in the GB storage unit 49, output to the carrier amplifier 16b.

For example, the GB calculation unit 48 subtracts a predetermined value from the gate bias stored in the GB storage unit 49 so as to reduce the current gate bias voltage output to the carrier amplifier 16b by 0.05 V. The calculated gate bias is output to the GB circuit 50, and the gate bias voltage smaller than the present voltage by 0.05 V is output to the gate of the transistor M11 of the carrier amplifier 16b.

The GB calculation unit 48 stores the calculated gate bias in the GB storage unit 49, and goes to step S3 in order to determine whether the Doherty circuit 16 satisfies the ACLR threshold by using the calculated gate bias.

[Step S9] Based on power of the feedback signal stored in the FB power storage unit 43, the GB selection unit 47 determines whether the output power of the Doherty circuit 16 is large. In other words, the GB selection unit 47 determines whether the peak amplifier 35 operates. When determining that the output power of the Doherty circuit 16 is large, the GB selection unit 47 goes to step S10 in order to control the gate bias of the peak amplifier 16e. When determining that the output power of the Doherty circuit 16 is not large, namely, small, the GB selection unit 47 goes to step S11 in order to control the gate bias of the carrier amplifier 16b.

[Step S10] The GB calculation unit 51 calculates the gate bias to be supplied to the peak amplifier 16e. Since the ACLR comparison unit 46 determines in step S5 that the ACLR is larger than or equal to the ACLR threshold, the GB calculation unit 51 adds a predetermined value to the current gate bias, which is stored in the GB storage unit 52, output to the peak amplifier 16e.

For example, the GB calculation unit 51 adds a predetermined value to the gate bias stored in the GB storage unit 52 so as to increase the current gate bias voltage output to the peak amplifier 16e by 0.1 V. The calculated gate bias is output to the GB circuit 53, and the gate bias voltage larger than the current voltage by 0.1 V is output to the gate of the transistor M12 of the peak amplifier 16e.

The GB calculation unit 51 stores the calculated gate bias in the GB storage unit 52, and goes to step S12 in order to determine whether the Doherty circuit 16 satisfies the ACLR threshold by using the calculated gate bias.

[Step S11] The GB calculation unit 48 calculates the gate bias to be supplied to the carrier amplifier 16b. Since the ACLR comparison unit 46 determines in step S5 that the ACLR is larger than or equal to the ACLR threshold, the GB calculation unit 48 adds a predetermined value to the current gate bias value, which is stored in the GB storage unit 49, output to the carrier amplifier 16b.

For example, the GB calculation unit 48 adds a predetermined value to the gate bias value stored in the GB storage unit 49 so as to increase the current gate bias voltage output to the carrier amplifier 16b by 0.05 V. The calculated gate bias is output to the GB circuit 50, and the gate bias voltage larger than the present voltage by 0.05 V is output to the gate of the transistor M11 of the carrier amplifier 16b.

The GB calculation unit 48 stores the calculated gate bias in the GB storage unit 49, and goes to step S12 to determine whether the Doherty circuit 16 satisfies the ACLR threshold by using the calculated gate bias.

[Step S12] The FFT unit 44 performs FFT processing of the feedback signal output from the ADC 21, and converts the feedback signal in the time domain into data in the frequency domain.

[Step S13] The ACLR calculation unit 45 calculates the carrier band power and the distortion band power to thereby calculate the ACLR based on the data in the frequency domain calculated by the FFT unit 44.

[Step S14] The ACLR comparison unit 46 compares the ACLR calculated by the ACLR calculation unit 45 and the ACLR threshold. When the calculated ACLR is smaller than the ACLR threshold, the ACLR comparison unit 46 ends the process. When the calculated ACLR is larger than or equal to the ACLR threshold, the ACLR comparison unit 46 goes to step S9 such that the Doherty circuit 16 satisfies the ACLR threshold.

Next, a reason why a size for changing the gate bias is different depending on the carrier amplifier 16b and the peak amplifier 16e will be described.

Figure 10:
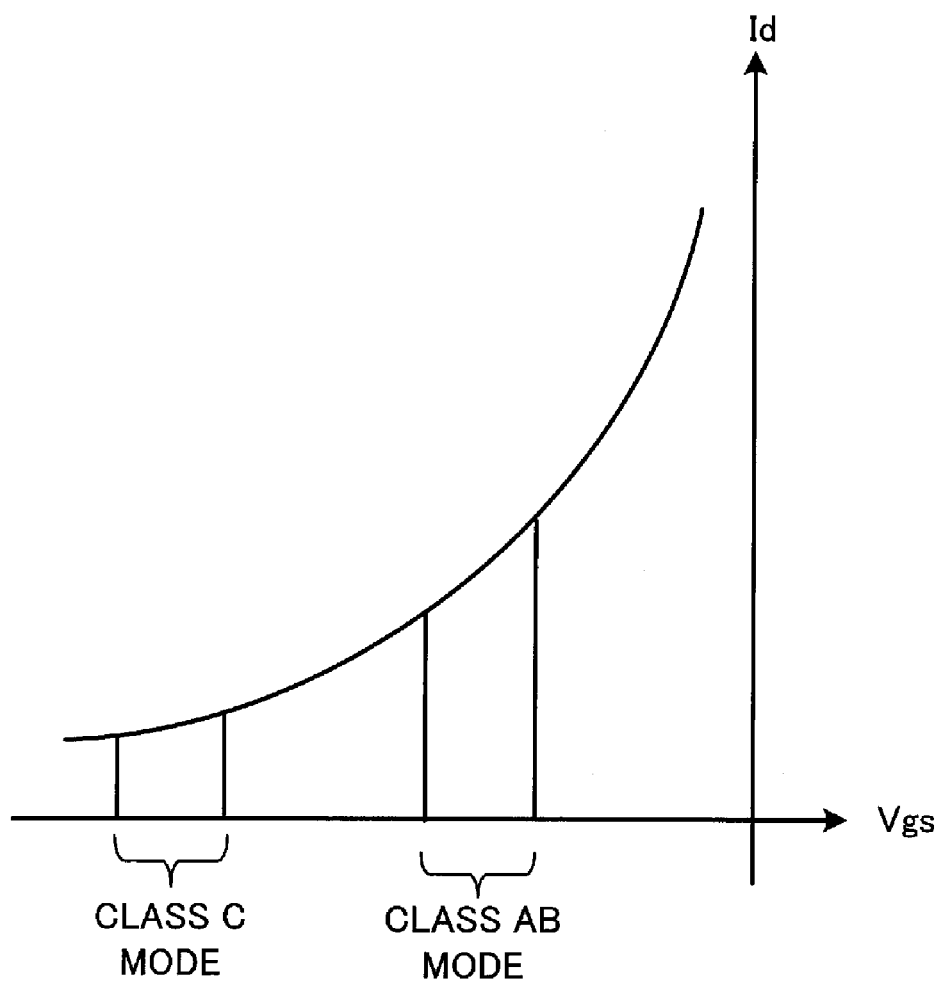
FIG. 10 illustrates the reason why a size of the gate bias to be supplied is different.

FIG. 10 illustrates the reason why a size of the gate bias to be supplied is different. In FIG. 10, there is illustrated a relationship between a gate-source voltage Vgs and a drain current Id flowing through the drain in the transistor.

As illustrated in FIG. 10, in the case of operating the transistor in class-C mode and in the case of operating the transistor in class-AB mode, a change size of the drain current Id is different with respect to the gate-source voltage Vgs. As illustrated in FIG. 10, for example, the class-AB mode is larger than the class-C mode in the change size of the drain current Id with respect to that of the gate-source voltage Vgs.

To cope with the above-described problem, the change size of the gate bias of the carrier amplifier 16b operating in class-A or AB mode is reduced more than that of the peak amplifier 16e operating in class-C mode. This process permits the drain current of the transistor M11 of the carrier amplifier 16b to be finely controlled in the same manner as in the peak amplifier 16e.

As described with reference to the flowchart of FIGS. 8 and 9, for example, the gate bias of the peak amplifier 16e is changed in units of 0.1 V. On the other hand, the gate bias of the carrier amplifier 16b is changed in units of 0.05 V smaller than 0.1 V.

As can be seen from the above sequence, when detecting the temperature change, the amplifying device of the transmitter calculates the ACLR, and compares the calculated ACLR and the ACLR threshold. When the calculated ACLR is smaller than the ACLR threshold, the amplifying device lowers the gate bias in the range in which the ACLR satisfies the ACLR threshold, and controls the gate bias at the optimal operating point of the Doherty circuit 16. On the other hand, when the calculated ACLR is larger than or equal to the ACLR threshold, the amplifying device raises the gate bias in the range in which the ACLR satisfies the ACLR threshold, and controls the gate bias at the optimal operating point of the Doherty circuit 16. This process permits the amplifying device to control the gate bias at the optimal operating point fluctuating based on the temperature change, and increase the power efficiency.

Next, a third embodiment will be described. In the second embodiment, the amplifying device changes the gate bias of the Doherty circuit 16 based on the temperature change. In the third embodiment, the amplifying device changes the gate bias of the Doherty circuit 16 based on the frequency change. In addition, as illustrated in FIG. 5, the optimal operating point of the Doherty circuit 16 changes based on the temperature, and also based on the frequency of the input signals. For example, the straight lines B11 and B12 illustrated in FIG. 5 move up and down based on the frequency of the signals input to the Doherty circuit 16.

Figure 11:
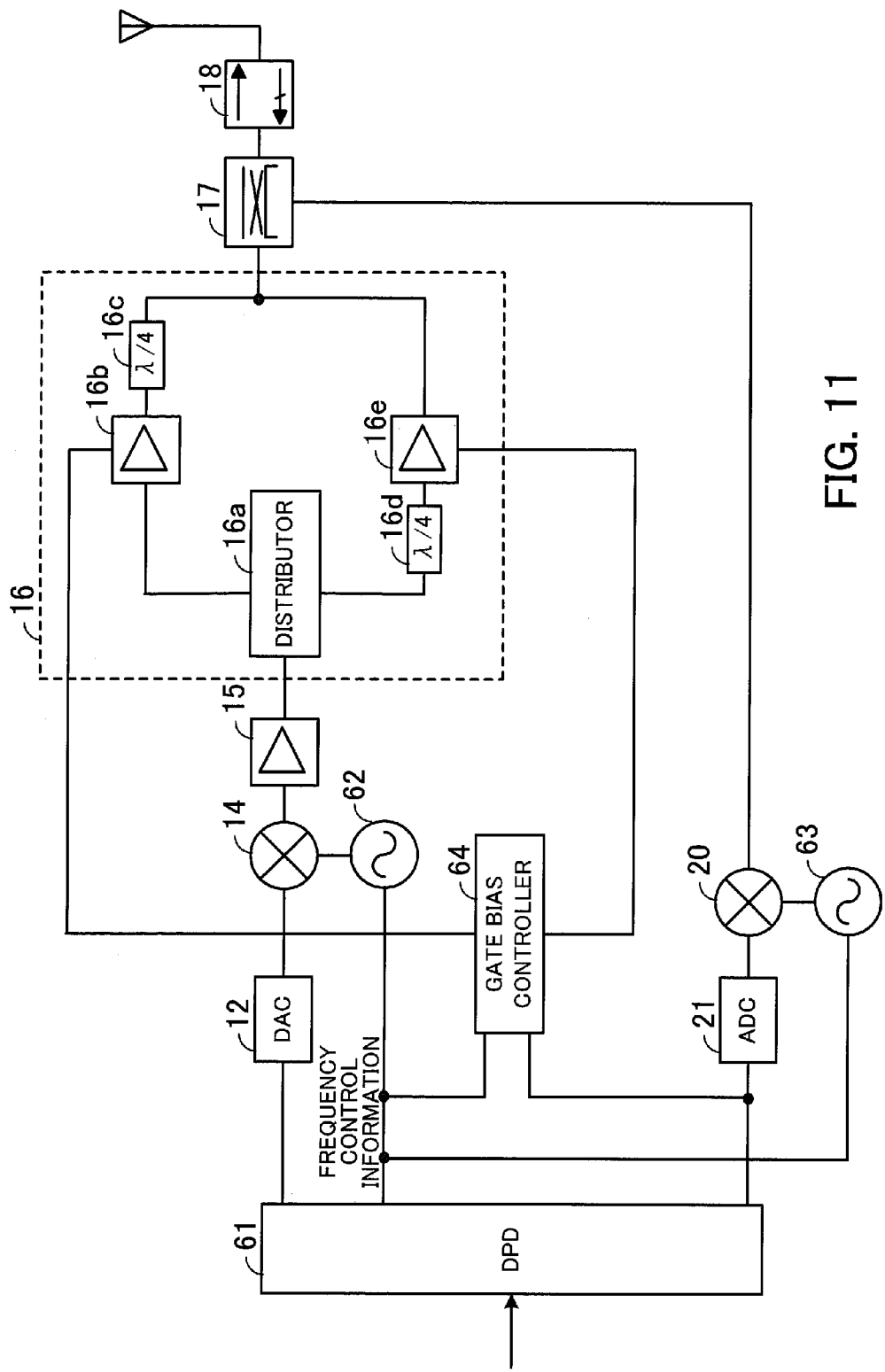
FIG. 11 is a block diagram illustrating the transmitter using the amplifying device according to a third embodiment.

FIG. 11 is a block diagram illustrating the transmitter using the amplifying device according to the third embodiment. In FIG. 11, the same circuit elements as those in FIG. 2 are indicated by the same reference numerals as in FIG. 2, and the description will not be repeated here.

The transmitter of FIG. 11 is designed to set radio frequencies according to user specifications. Radio frequencies set by the user are output to the oscillators 62 and 63 from the DPD 61 as frequency control information. The frequency control information includes information on the radio frequencies set to the transmitter.

According to the frequency control information output from the DPD 61, the oscillators 62 and 63 output oscillation signals of the radio frequencies set by the user. As the oscillators 62 and 63, for example, a PLL oscillator is used.

To the transmitter, a predetermined radio frequency is set as a default. To the transmitter, for example, a predetermined radio frequency (of the default) is set in factory shipping. When planning to use the transmitter at the radio frequency different from that in factory shipping, the user sets to the transmitter the radio frequency which the user plans to use before or after application of power.

The frequency control information output from the DPD 61 is output also to the gate bias controller 64. Based on the frequency control information, the gate bias controller 64 detects a change in the frequency set to the oscillators 62 and 63, and changes the gate bias of the Doherty circuit 16.

The gate bias controller 64 is designed to output the gate bias at the optimal operating point, for example, in the defaulted radio frequency in the factory shipping. As a result, for example, when the user changes the radio frequency of the transmitter before the application of power, the gate bias output from the gate bias controller 64 fails to be positioned at the optimal operating point. To cope with the above-described problem, the gate bias controller 64 detects a change in the radio frequency based on a difference between the defaulted frequency control information and the frequency control information output from the DPD 61, and changes the gate bias so as to be positioned at the optimal operating point corresponding to the radio frequency set by the user.

When the user changes the radio frequency of the transmitter after the power source, the frequency control information corresponding to the radio frequency changed by the user is output from the DPD 61. The gate bias controller 64 detects a change in the radio frequency based on a difference between the frequency control information before and after the change, and changes the gate bias so as to be positioned at the optimal operating point corresponding to the radio frequency set by the user.

Figure 12:
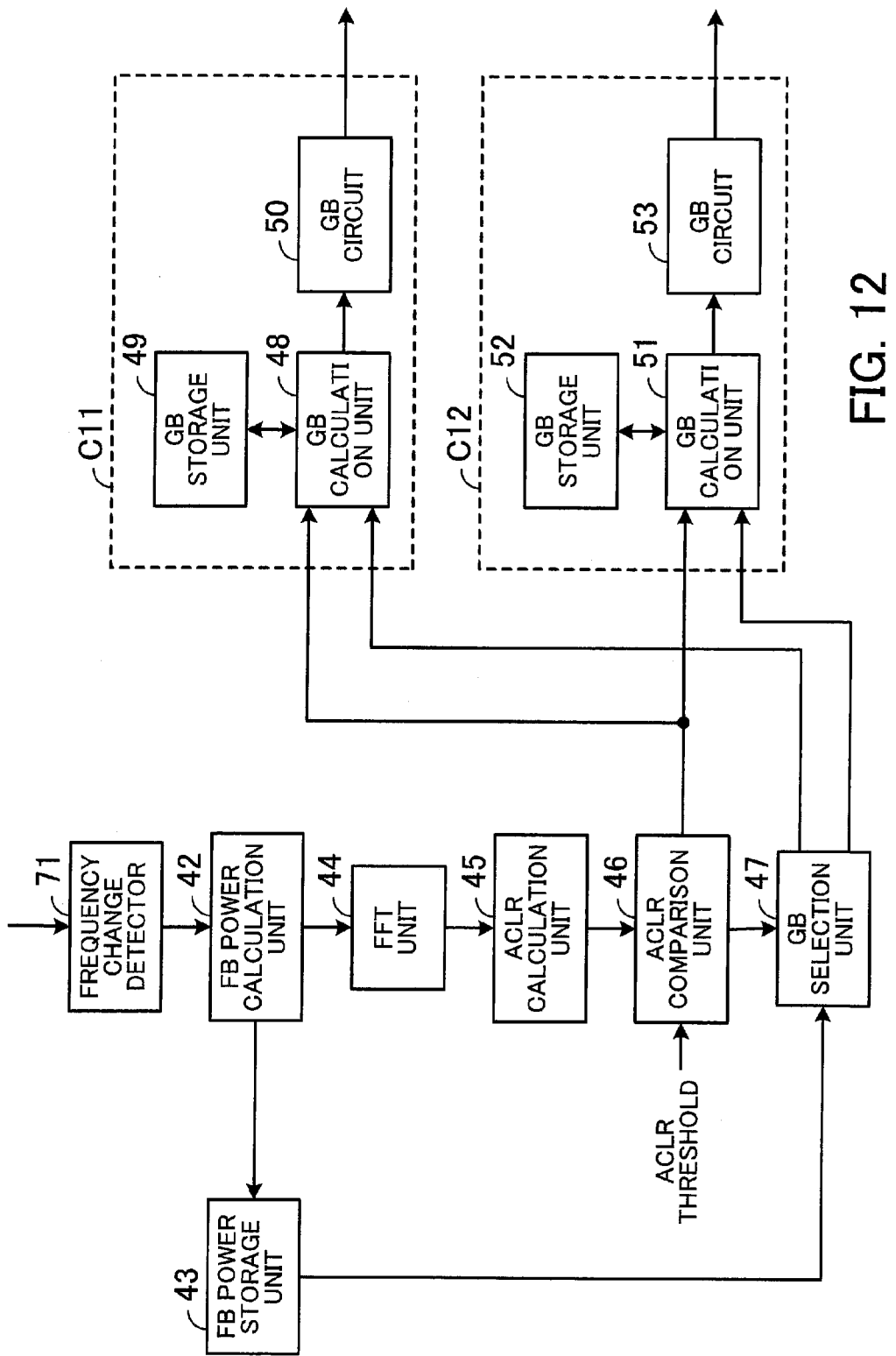
FIG. 12 is a block diagram illustrating the gate bias controller.

FIG. 12 is a block diagram illustrating the gate bias controller. In FIG. 12, the same circuit elements as those in FIG. 6 are indicated by the same reference numerals as in FIG. 6, and the description will not be repeated here.

In FIG. 12, a frequency change detector 71 is different from the temperature change detector 41 in FIG. 6. Based on the frequency control information output from the DPD 61, the frequency change detector 71 determines whether the frequencies of the oscillators 62 and 63 are changed. When the frequency change detector 71 detects a change in the radio frequency, the FB power calculation unit 42, FB power storage unit 43, FFT unit 44, ACLR calculation unit 45, ACLR comparison unit 46, GB selection unit 47, GB calculation units 48 and 51, GB storage units 49 and 52, and GB circuits 50 and 53 illustrated in FIG. 12 calculate and change the optimal operating point of the gate bias.

When the frequencies of the oscillators 62 and 63 are changed, the frequency change detector 71 stores the frequency control information output from the DPD 61. When the frequency control information is then output from the DPD 61, based on the output frequency control information and the stored frequency control information, the frequency change detector 71 determines whether the radio frequency is changed.

Figure 13:
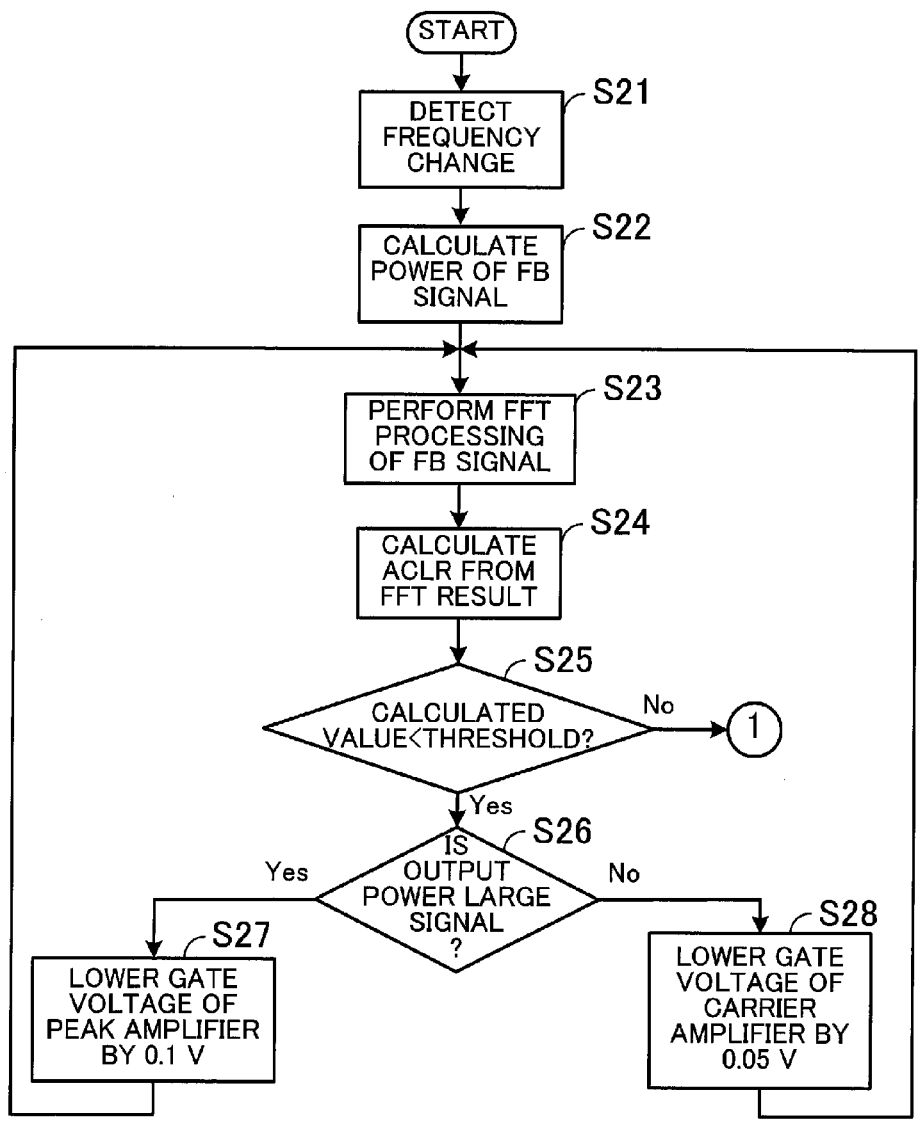
FIG. 13 is a flowchart illustrating the operations of the gate bias controller.
Figure 14:
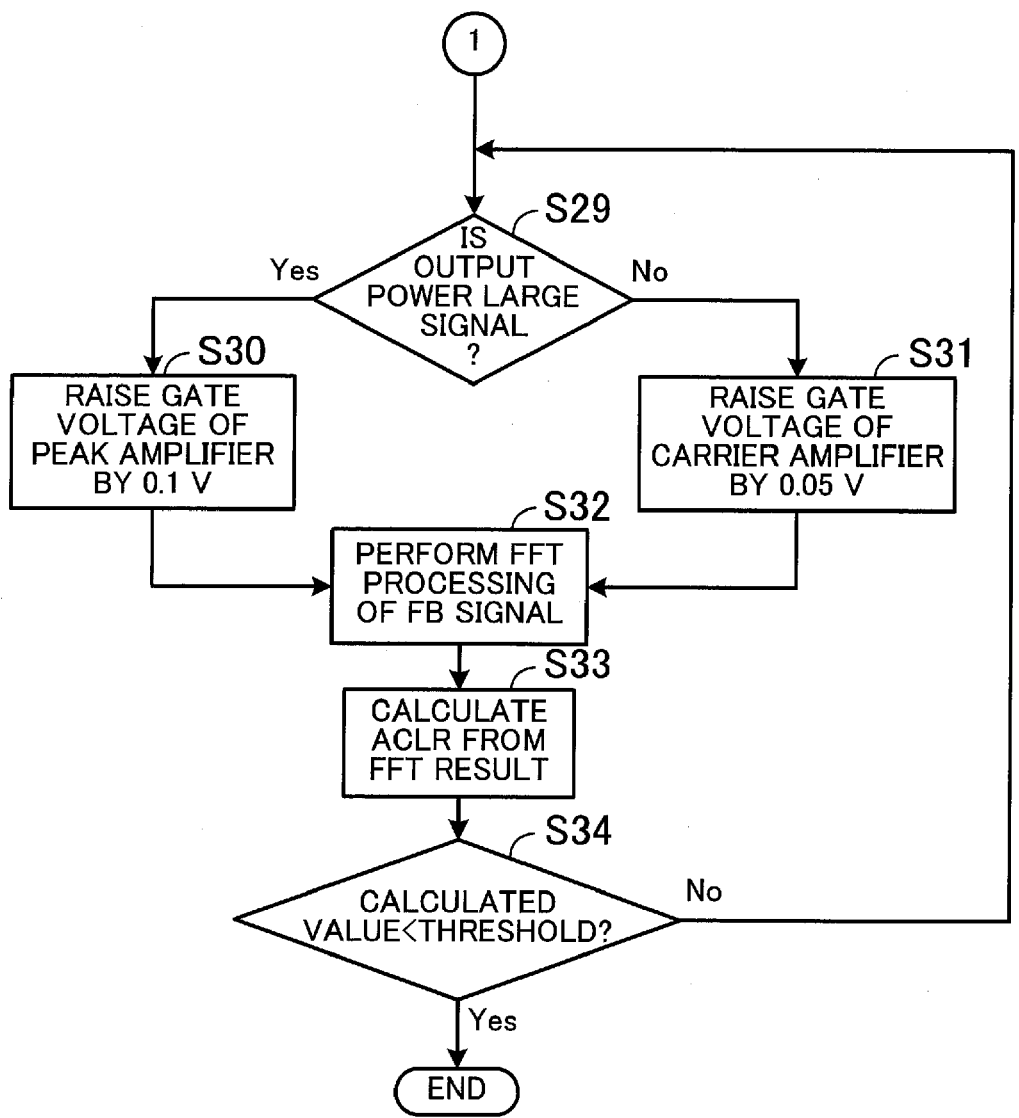
FIG. 14 is a flowchart illustrating the operations of the gate bias controller.

FIGS. 13 and 14 are a combined flowchart illustrating the operations of the gate bias controller. [Step S21] Based on the frequency control information output from the DPD 61, the frequency change detector 71 determines whether the frequencies of the oscillators 62 and 63 are changed. The frequency change detector 71 determines a change in the radio frequency, for example, based on the stored frequency control information and the frequency control information output from the DPD 61. When the radio frequency is changed, the gate bias controller 64 performs the process of the following steps and controls the gate bias of the Doherty circuit 16 to be positioned at the optimal operating point.

[Steps S22 to S34] In the process of steps S22 to S34, the same process as that of steps S2 to S14 of the combined flowchart illustrated in FIGS. 8 and 9 is performed, and the description will not be repeated.

As can be seen from the above sequence, when detecting the frequency change of the signals input to the Doherty circuit 16, the amplifying device of the transmitter calculates the ACLR and compares the calculated ACLR and the ACLR threshold. If the calculated ACLR is smaller than the ACLR threshold, the amplifying device lowers the gate bias in the range in which the ACLR satisfies the ACLR threshold, and controls the gate bias to be positioned at the optimal operating point of the Doherty circuit 16. On the other hand, if the calculated ACLR is larger than or equal to the ACLR threshold, the amplifying device raises the gate bias in the range in which the ACLR satisfies the ACLR threshold, and controls the gate bias to be positioned at the optimal operating point of the Doherty circuit 16. This process permits the amplifying device to control the gate bias to be positioned at the optimal operating point fluctuating based on the frequency change, and further the amplifying device to increase the power efficiency.

Next, a fourth embodiment will be described. In the second embodiment, the amplifying device changes the gate bias of the Doherty circuit 16 based on the temperature change. In the third embodiment, the amplifying device changes the gate bias of the Doherty circuit 16 based on the frequency change. In the fourth embodiment, the amplifying device changes the gate bias of the Doherty circuit 16 based on both or any one of the temperature change and the frequency change.

Figure 15:
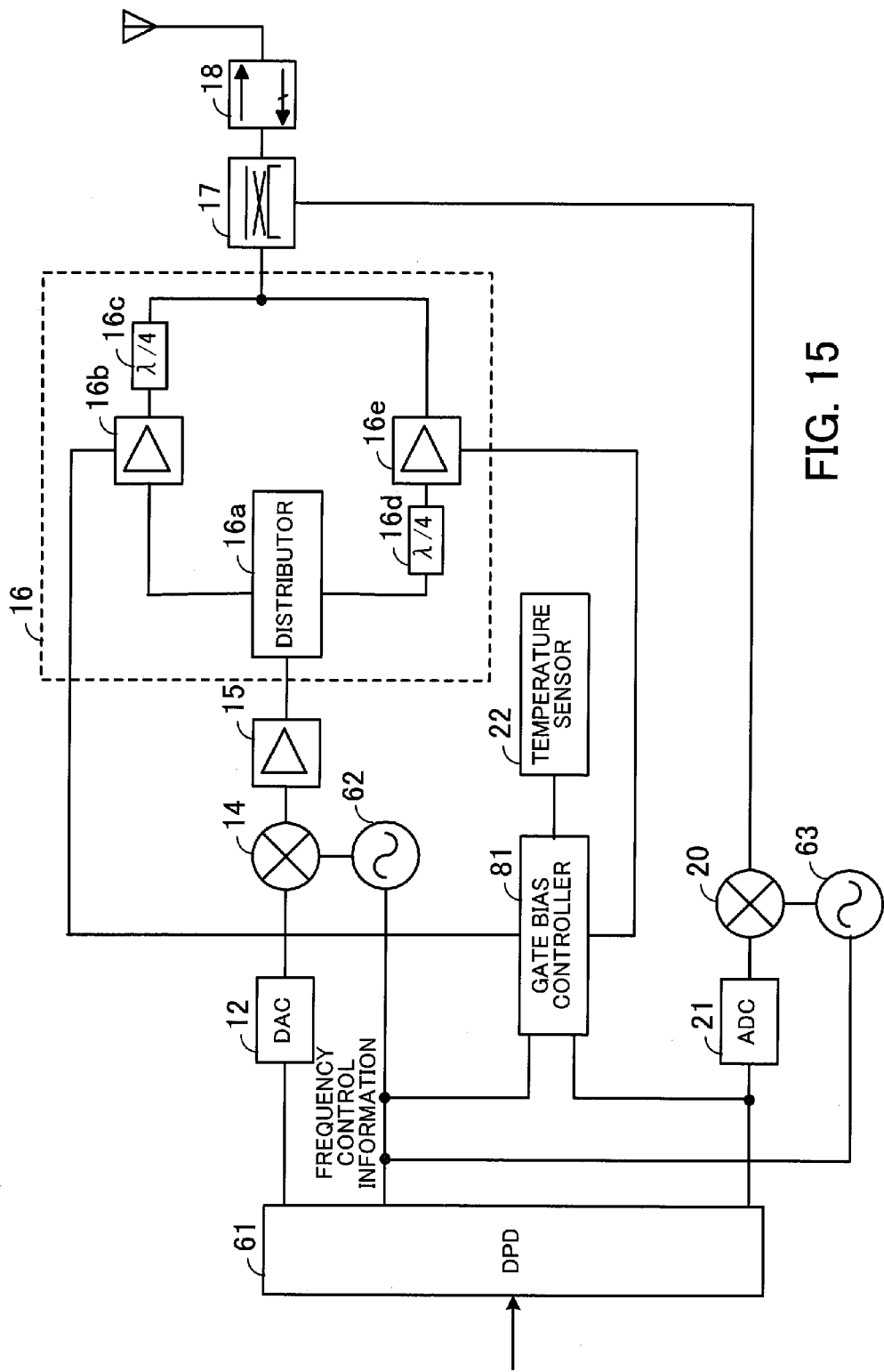
FIG. 15 is a block diagram illustrating the transmitter using the amplifying device according to a fourth embodiment.

FIG. 15 is a block diagram illustrating the transmitter using the amplifying device according to the fourth embodiment. In FIG. 15, the same circuit elements as those in FIGS. 2 and 11 are indicated by the same reference numerals as in FIGS. 2 and 11, and the description will not be repeated here.

The transmitter illustrated in FIG. 15 has a gate bias controller 81. The gate bias controller 81 has functions of the gate bias controller 23 illustrated in FIG. 2 and those of the gate bias controller 64 illustrated in FIG. 11. Specifically, the gate bias controller 81 detects the temperature change based on the temperature measured by the temperature sensor 22, and controls the gate bias output to the Doherty circuit 16 to be positioned at the optimal operating point. In addition, the gate bias controller 81 detects a change in the radio frequency based on the frequency control information output from the DPD 61, and controls the gate bias output to the Doherty circuit 16 to be positioned at the optimal operating point.

Figure 16:
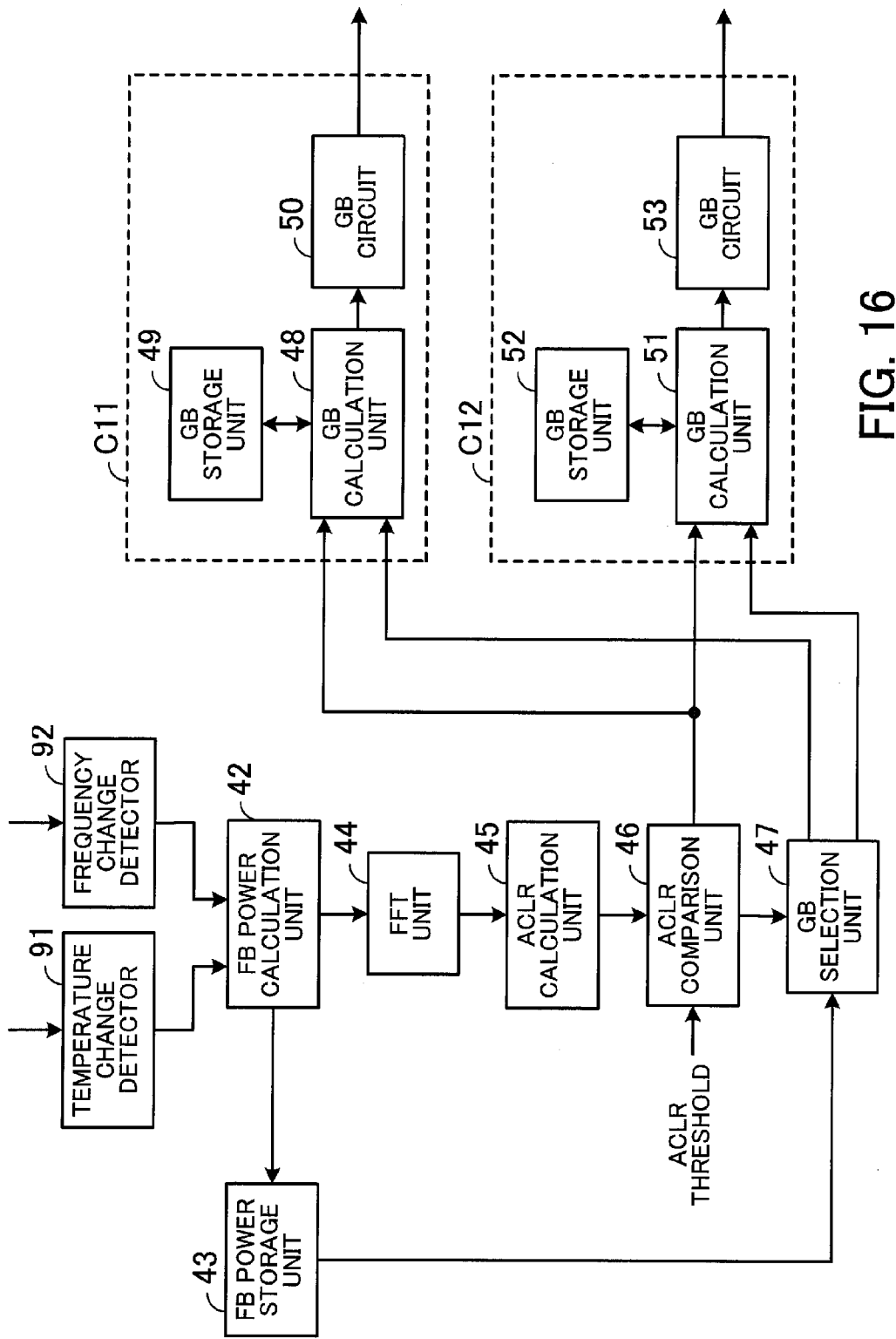
FIG. 16 is a block diagram illustrating the gate bias controller.

FIG. 16 is a block diagram illustrating the gate bias controller. In FIG. 16, the same circuit elements as those in FIGS. 6 and 12 are indicated by the same reference numerals as in FIGS. 6 and 12, and the description will not be repeated here.

The gate bias controller 81 illustrated in FIG. 16 has a temperature change detector 91 and a frequency change detector 92. The temperature change detector 91 has the same functions as those of the temperature change detector 41 described in FIG. 6. The frequency change detector 92 has the same functions as those of the frequency change detector 71 illustrated in FIG. 12. When the temperature change detector 91 detects the temperature change, the FB power calculation unit 42, FB power storage unit 43, FFT unit 44, ACLR calculation unit 45, ACLR comparison unit 46, GB selection unit 47, GB calculation units 48 and 51, GB storage units 49 and 52, and GB circuits 50 and 53 illustrated in FIG. 16 calculate and change the optimal operating point of the gate bias. Further, when the frequency change detector 92 detects a change in the radio frequency, they calculate and change the optimal operating point of the gate bias.

Figure 17:
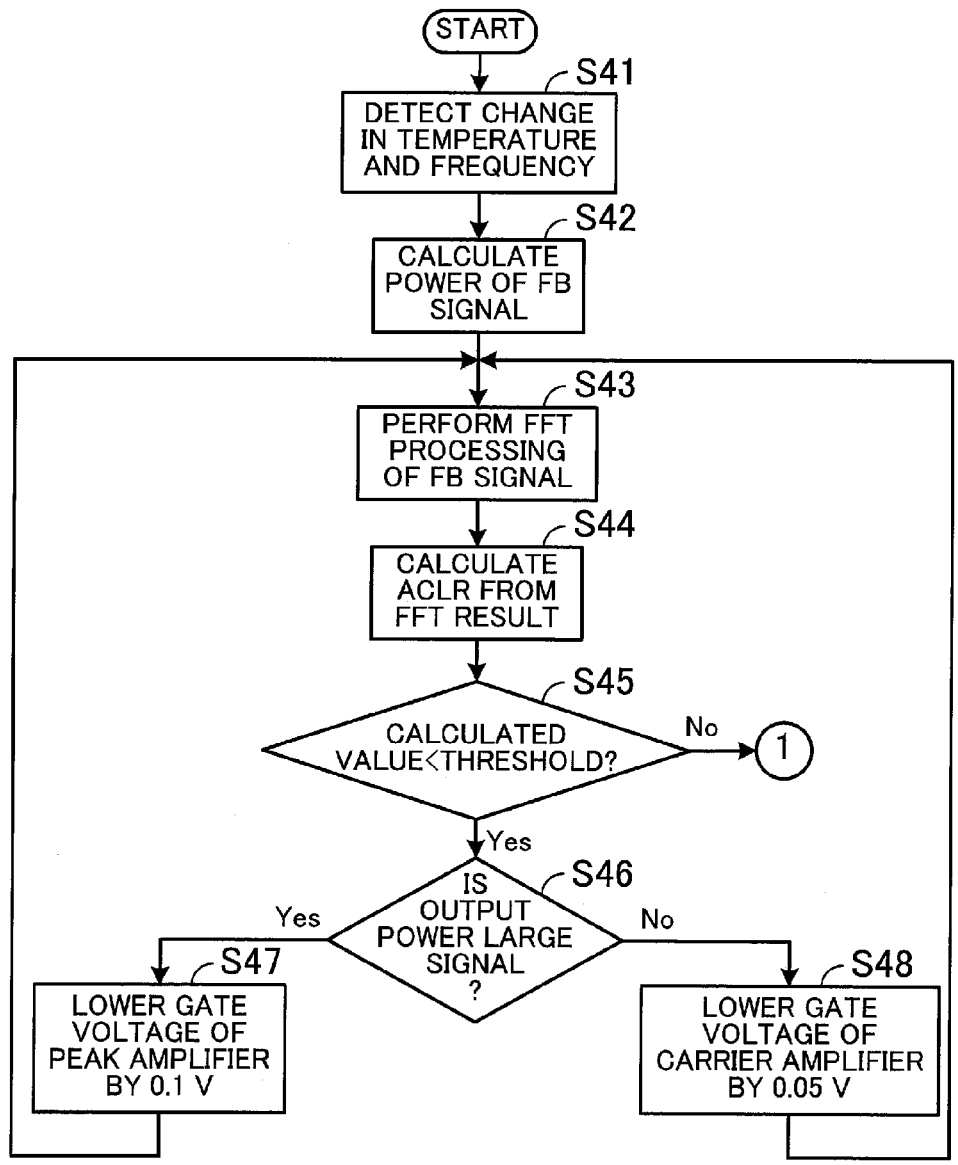
FIG. 17 is a flowchart illustrating the operations of the gate bias controller.
Figure 18:
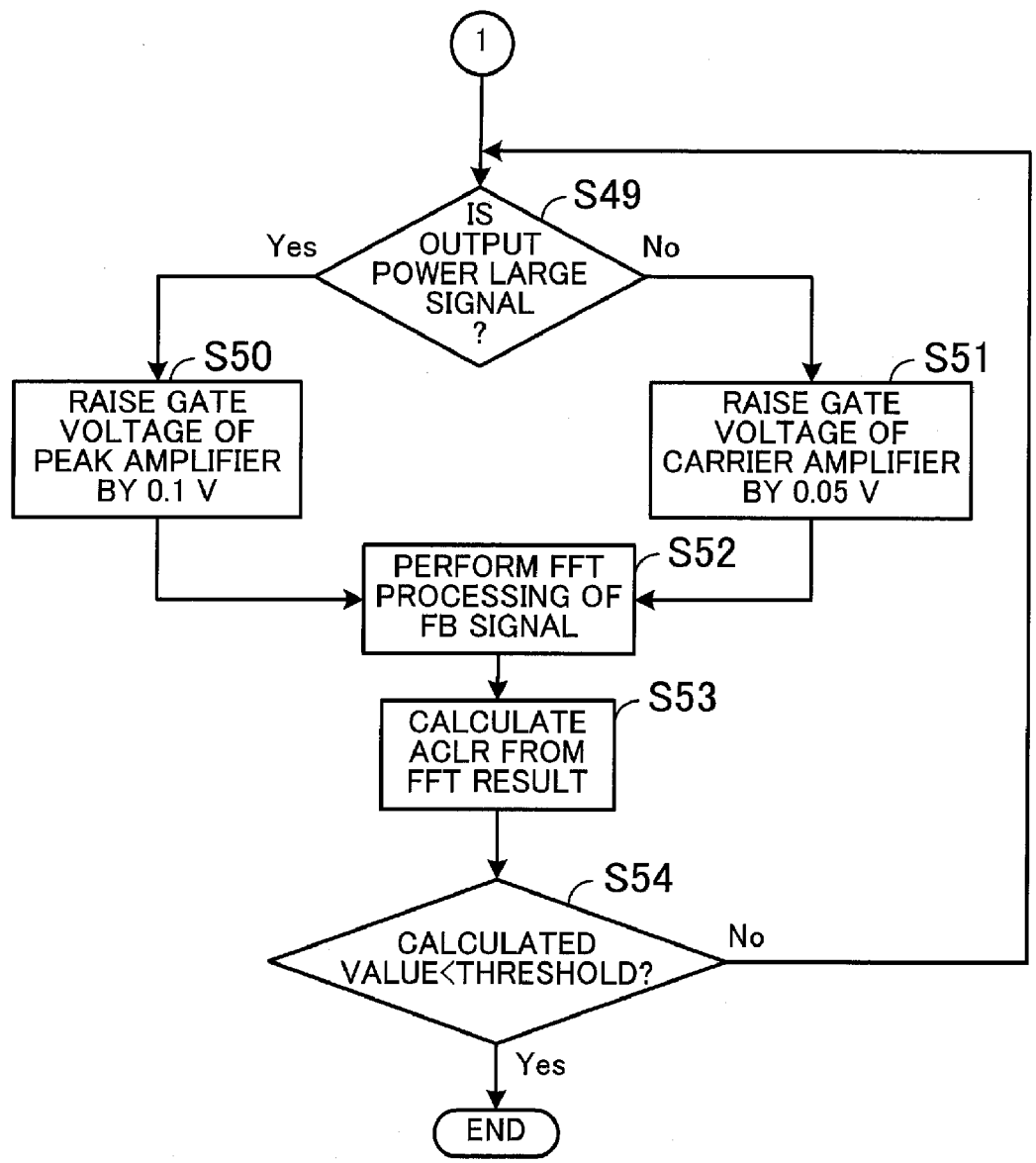
FIG. 18 is a flowchart illustrating the operations of the gate bias controller.

FIGS. 17 and 18 are a combined flowchart illustrating the operations of the gate bias controller.

[Step S41] Based on the temperature measured by the temperature sensor 22, the temperature change detector 91 determines whether the temperature changes. Based on the frequency control information output from the DPD 61, the frequency change detector 92 determines whether the frequency of the oscillators 62 and 63 changes. For example, the frequency change detector 92 determines a change in the radio frequency based on the stored frequency control information and the frequency control information output from the DPD 61. When both or any one of the temperature and the radio frequency changes, the gate bias controller 81 performs the process of the following steps, and controls the gate bias of the Doherty circuit 16 to be positioned at the optimal operating point.

[Steps S42 to S54] In the process of steps S42 to S54, the same process as that of steps S2 to S14 of the combined flowchart illustrated in FIGS. 8 and 9 is performed, and the description will not be repeated.

As can be seen from the above sequence, when detecting the temperature change or the frequency change of the signals input to the Doherty circuit 16, the amplifying device of the transmitter calculates the ACLR, and compares the calculated ACLR and the ACLR threshold. If the calculated ACLR is smaller than the ACLR threshold, the amplifying device lowers the gate bias in the range in which the ACLR satisfies the ACLR threshold, and controls the gate bias to be positioned at the optimal operating point of the Doherty circuit 16. On the other hand, if the calculated ACLR is larger than or equal to the ACLR threshold, the amplifying device raises the gate bias in the range in which the ACLR satisfies the ACLR threshold, and controls the gate bias to be positioned at the optimal operating point of the Doherty circuit 16. This process permits the amplifying device to control the gate bias to be positioned at the optimal operating point fluctuating based on the temperature change or the frequency change, and further the amplifying device to increase the power efficiency.

The proposed amplifying device can increase the power efficiency even if the optimal operating point fluctuates based on the temperature change.

In addition, the amplifying device can increase the power efficiency even if the optimal operating point fluctuates based on the frequency change of the input signal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions and alterations could be made hereto without departing from the spirit and scope of the invention.

What is claimed is:

1. An amplifying device for amplifying a signal, comprising:
    an amplification unit including a first amplifier to amplify the signal and a second amplifier to amplify the signal when the signal has a predetermined level or more;
    a detector to detect a temperature change;
    a calculation unit to calculate an adjacent channel leakage power ratio of an output signal output from the amplification unit in response to detection of the temperature change of the detector; and
    a controller to control gate biases of the first and second amplifiers based on the adjacent channel leakage power ratio calculated by the calculation unit.

2. The amplifying device according to claim 1, wherein the controller includes:
    a first gate bias calculation unit to calculate the gate bias of the first amplifier based on a comparison result between the adjacent channel leakage power ratio calculated by the calculation unit and a predetermined threshold; and
    a second gate bias calculation unit to calculate the gate bias of the second amplifier based on the comparison result between the adjacent channel leakage power ratio calculated by the calculation unit and the predetermined threshold.

3. The amplifying device according to claim 2, wherein the first and second gate bias calculation units calculate the gate bias by adding or subtracting a predetermined value to or from the previously-calculated gate bias.

4. The amplifying device according to claim 3, wherein the predetermined value to be added or subtracted by the first gate bias calculation unit is smaller than the predetermined value to be added or subtracted by the second gate bias calculation unit.

5. The amplifying device according to claim 2, further comprising:
   a power calculation unit to calculate power of the output signal output from the amplification unit; and
   a selection unit to make a selection based on a power calculation result of the power calculation unit such that any one of the first and second gate bias calculation units calculates the gate bias.

6. The amplifying device according to claim 5, wherein when power calculated by the power calculation unit is larger than the predetermined threshold, the selection unit selects the second gate bias calculation unit.

7. An amplifying device for amplifying a signal, comprising:
   an amplification unit including a first amplifier to amplify the signal and a second amplifier to amplify the signal when the signal has a predetermined level or more;
   a detector to detect a frequency change of the signal;
   a calculation unit to calculate an adjacent channel leakage power ratio of an output signal output from the amplification unit in response to detection of the frequency change of the detector; and
   a controller to control gate biases of the first and second amplifiers based on the adjacent channel leakage power ratio calculated by the calculation unit.

8. An amplifying device for amplifying a signal, comprising:
   an amplification unit including a first amplifier to amplify the signal and a second amplifier to amplify the signal when the signal has a predetermined level or more;
   a temperature change detector to detect a temperature change;
   a frequency change detector to detect a frequency change of the signal;
   a calculation unit to calculate an adjacent channel leakage power ratio of an output signal output from the amplification unit in response to both or any one of detection of the temperature change of the temperature change detector and detection of the frequency change of the frequency change detector; and
   a controller to control gate biases of the first and second amplifiers based on the adjacent channel leakage power ratio calculated by the calculation unit.

* * * * *